US010090402B1

(12) United States Patent
Park et al.

(10) Patent No.: US 10,090,402 B1
(45) Date of Patent: Oct. 2, 2018

(54) METHODS OF FORMING FIELD EFFECT TRANSISTORS (FETS) WITH GATE CUT ISOLATION REGIONS BETWEEN REPLACEMENT METAL GATES

(71) Applicant: GLOBALFOUNDRIES INC., Grand Cayman (KY)

(72) Inventors: Chanro Park, Clifton Park, NY (US); Chang Ho Maeng, Cohoes, NY (US); Pei Liu, Clifton Park, NY (US); Junsic Hong, Malta, NY (US); Laertis Economikos, Wappingers Falls, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/658,835

(22) Filed: Jul. 25, 2017

(51) Int. Cl.
*H01L 29/66* (2006.01)
*H01L 29/06* (2006.01)

(52) U.S. Cl.
CPC .... *H01L 29/66795* (2013.01); *H01L 29/0649* (2013.01); *H01L 29/6656* (2013.01); *H01L 29/66545* (2013.01)

(58) Field of Classification Search
CPC .......... H01L 29/66795; H01L 29/0649; H01L 29/66545; H01L 29/6656
See application file for complete search history.

(56) References Cited

U.S. PATENT DOCUMENTS

| 4,975,144 | A | 12/1990 | Yamazaki et al. |
| 6,664,154 | B1 | 12/2003 | Bell et al. |
| 8,877,642 | B2 | 11/2014 | Hu |
| 9,337,254 | B1 | 5/2016 | Basker et al. |
| 9,397,004 | B2 | 7/2016 | Bouche et al. |
| 9,911,736 | B1 * | 3/2018 | Zang ................... H01L 27/0886 |
| 2013/0273702 | A1 | 10/2013 | Zheng |
| 2015/0236106 | A1 | 8/2015 | Zaleski et al. |
| 2015/0340461 | A1 | 11/2015 | Wei et al. |

(Continued)

OTHER PUBLICATIONS

MicroChem, "Novel Spin-on Carbon Hardmasks",http://microchem.com/pdf/IM-HM-140.pdf, pp. 1-2, Date unknown.

*Primary Examiner* — Laura Menz
*Assistant Examiner* — Candice Y Chan
(74) *Attorney, Agent, or Firm* — Gibb & Riley, LLC; Francois Pagette

(57) ABSTRACT

The method includes steps for improving gate cut isolation region critical dimension (CD) control. Prior to replacement metal gate (RMG) formation, a first sacrificial gate adjacent to first and second channel regions and made of a first sacrificial material (e.g., polysilicon or amorphous silicon) is replaced with a second sacrificial gate made of a second sacrificial material (e.g., amorphous carbon) that is more selectively and anisotropically etchable. A cut is made, dividing the second sacrificial gate into first and second sections, and the cut is then filled with a dielectric to form the gate cut isolation region. The second sacrificial material ensures that, when an opening in a mask pattern used to form the cut extends over a gate sidewall spacer and interlayer dielectric (ILD) material, recesses are not form within the spacer or ILD. Thus, the CD of the isolation region can be controlled.

13 Claims, 31 Drawing Sheets

(56) References Cited

U.S. PATENT DOCUMENTS

2016/0133632 A1* 5/2016 Park ................ H01L 21/823828
           257/369
2017/0148682 A1* 5/2017 Basker ............ H01L 21/823431
2017/0229451 A1* 8/2017 Chang ................ H01L 21/0228

* cited by examiner

METHODS OF FORMING FIELD EFFECT TRANSISTORS (FETS) WITH GATE CUT ISOLATION REGIONS BETWEEN REPLACEMENT METAL GATES

BACKGROUND

Field of the Invention

The present invention relates to integrated circuits (ICs) and, more particularly, to methods of forming an IC structure that incorporates multiple field effect transistors (e.g., multiple fin-type field effect transistors (FINFETs)) with replacement metal gates (RMGs) and a gate cut isolation region between the RMGs.

Description of Related Art

In integrated circuit (IC) design, cells (also referred to as library elements) typically represent a set of devices (e.g., a set of fin-type field effect transistors (FINFETs)) and the interconnect structure(s) that connect those FINFETs. An exemplary cell can incorporate multiple parallel semiconductor fins, including at least one first semiconductor fin with a first channel region and first source/drain regions for at least one first-type FINFET (e.g., a P-type FINFET) and at least one second semiconductor fin with a second channel region and second source/drain regions for at least one second-type FINFET (e.g., an N-type FINFET). A first gate (e.g., a first replacement metal gate (RMG)) can traverse the first semiconductor fin(s) at the first channel region and a second gate (e.g., a second replacement metal gate (RMG)) can be in end-to-end alignment with the first gate and can traverse the second semiconductor fin(s) at the second channel region. Depending upon the cell design, the first gate and the second gate can be physically separated and electrically isolated from each other by a gate cut isolation region, which is positioned laterally between adjacent ends of the two gates in an area between the first semiconductor fin(s) and the second semiconductor fin(s).

SUMMARY

Disclosed herein are embodiments of an improved method for forming an integrated circuit (IC) structure that incorporates multiple field effect transistors (FETs) (e.g., fin-type field effect transistors (FINFETs)) with replacement metal gates (RMGs) and a gate cut isolation region between the RMGs.

Generally, the embodiments of the method disclosed herein can include polishing an interlayer dielectric (ILD) material to expose a first sacrificial gate, which is made of a first sacrificial material (e.g., polysilicon or amorphous silicon), and a sidewall spacer that is adjacent to the first sacrificial gate. The first sacrificial gate can be selectively removed to form a preliminary gate opening that exposes portions of a conformal dielectric layer adjacent to a first channel region of a first semiconductor fin and a second channel region of a second semiconductor fin. A second sacrificial material (e.g., amorphous carbon), which is different from the first sacrificial material and, more specifically, which is more selectively and anisotropically etchable than the first sacrificial material, can be deposited onto the ILD material and into the preliminary gate opening to form a second sacrificial gate. Then, a cut can be formed in the second sacrificial gate. Specifically, the cut can be formed such that it extends vertically through the second sacrificial gate and such that it divides the second sacrificial gate into a first section adjacent to the first channel region and a second section adjacent to the second channel region. Dielectric fill material can be deposited into the cut to form a gate cut isolation region. Subsequently, the first and second sections of the second sacrificial gate can be replaced with first and second replacement metal gates (RMGs), respectively, that are physically and electrically isolated from each other by the gate cut isolation region.

More specifically, the embodiments of the method disclosed herein can include forming multiple fin-type field effect transistors (FINFETs) including at least a first FINFET and a second FINFET positioned laterally adjacent to the first FINFET. To form the FINFETs, multiple semiconductor fins can be formed on a substrate including at least a first semiconductor fin for the first FINFET and a second semiconductor fin for the second FINFET, wherein the second semiconductor fin is adjacent and parallel to the first semiconductor fin. A conformal dielectric layer can be formed over the first semiconductor fin and the second semiconductor fin. A first sacrificial gate can be formed on the conformal dielectric layer such that it traverses a first channel region of the first FINFET in the first semiconductor fin and a second channel region of the second FINFET in the second semiconductor fin. This first sacrificial gate can be made of a first sacrificial material (e.g., polysilicon or amorphous silicon). A sidewall spacer can be formed on the sacrificial gate. Following formation of the first sacrificial gate and sidewall spacer, source/drain regions for the FINFETs can be formed. That is, first source/drain regions for the first FINFET can be formed in the first semiconductor fin such that the first channel region is positioned laterally between the first source/drain regions. Additionally, second source/drain regions can be formed in the second semiconductor fin such that the second channel region is positioned laterally between the second source/drain regions. A blanket layer of interlayer dielectric (ILD) material can subsequently be deposited so as to cover the first sacrificial gate, the sidewall spacer, the first source/drain regions and the second source/drain regions. This ILD material can then be polished in order to expose a top surface of the first sacrificial gate. The first sacrificial gate can then be selectively removed in order to form a preliminary gate opening, which exposes portions of the conformal dielectric layer adjacent to the first channel region for the first FINFET and the second channel region for the second FINFET. Next, a second sacrificial material (e.g., amorphous carbon), which is different from the first sacrificial material and, more specifically, which is more selectively and anisotropically etchable than the first sacrificial material, can be deposited onto the ILD material and into the preliminary gate opening to form a second sacrificial gate. Then, a cut can be formed in the second sacrificial gate. Specifically, the cut can be formed such that it extends vertically through the second sacrificial gate and such that it divides the second sacrificial gate into a first section adjacent to the first channel region and a second section adjacent to the second channel region. Dielectric fill material can be deposited into the cut to form a gate cut isolation region. Subsequently, the first and second sections of the second sacrificial gate can be replaced with first and second replacement metal gates (RMGs), respectively, that are physically and electrically isolated from each other by the gate cut isolation region.

Optionally, an embodiment of the method disclosed herein can further include forming one or more additional isolation regions at essentially the same time and in essentially the same manner as the gate cut isolation region.

Specifically, this embodiment of the method can include forming multiple semiconductor fins including at least a first semiconductor fin and a second semiconductor fin, which is adjacent and parallel to the first semiconductor fin. A conformal dielectric layer can be formed on the semiconductor fins. Multiple first sacrificial gates can then be formed on the conformal dielectric layer including at least a main first sacrificial that traverses a first channel region of a first fin-type field effect transistor (FINFET) in the first semiconductor fin and a second channel region of a second FINFET in the second semiconductor fin and an additional first sacrificial gate that is parallel to and physically separated from the main first sacrificial gate (e.g., above an isolation layer and adjacent to, but physically separated from, ends of the first semiconductor fin and the second semiconductor fin). Additionally, sidewall spacers can be formed on the multiple first sacrificial gates. Following formation of the first sacrificial gates and sidewall spacers, source/drain regions for the FINFETs can be formed. That is, first source/drain regions for the first FINFET can be formed in the first semiconductor fin such that the first channel region is positioned laterally between the first source/drain regions. Additionally, second source/drain regions can be formed in the second semiconductor fin such that the second channel region is positioned laterally between the second source/drain regions. A blanket layer of interlayer dielectric (ILD) material can subsequently be deposited so as to cover the first sacrificial gates, the sidewall spacers, the first source/drain regions and the second source/drain regions. This ILD material can then be polished in order to expose the top surfaces of the first sacrificial gates. Then, the first sacrificial gates can be selectively removed in order to form preliminary gate openings. Next, a second sacrificial material (e.g., amorphous carbon), which is different from the first sacrificial material and, more specifically, which is more selectively and anisotropically etchable than the first sacrificial material, can be deposited onto the ILD material and into the preliminary gate openings to form multiple second sacrificial gates including at least a main second sacrificial gate, which replaces the main first sacrificial gate (i.e., which traverses the first channel region of the first FINFET and the second channel region of the second FINFET), and an additional second sacrificial gate, which replaces the additional first sacrificial gate. A cut can then be formed in the main second sacrificial gate such that it extends vertically through the main second sacrificial gate and, thereby divides the main second sacrificial gate into a first section adjacent to the first channel region and a second section adjacent to the second channel region. During formation of this cut, the additional second sacrificial gate can also be removed, e.g., in its entirety, so as to form a trench. Dielectric fill material can be deposited into the cut and into the trench in order to form both a gate cut isolation region and an additional isolation region, respectively. Subsequently, the first and second sections of the main second sacrificial gate can be replaced with first and second replacement metal gates (RMGs), respectively, that are physically and electrically isolated from each other by the gate cut isolation region.

In the above-describe method embodiments, the use of the second sacrificial material ensures that, when a gate cut opening or, if applicable, a gate removal opening in a mask pattern extends over the gate sidewall spacer and the interlayer dielectric (ILD) material, recesses will not be formed within the gate sidewall spacer or ILD material during a subsequent selective anisotropic etch process of the second sacrificial material performed using the mask pattern. By avoiding the formation of such recesses, which would subsequently be filled with the dielectric fill material, the embodiments effectively control the critical dimension of the gate cut isolation region and, if applicable, the additional isolation region.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
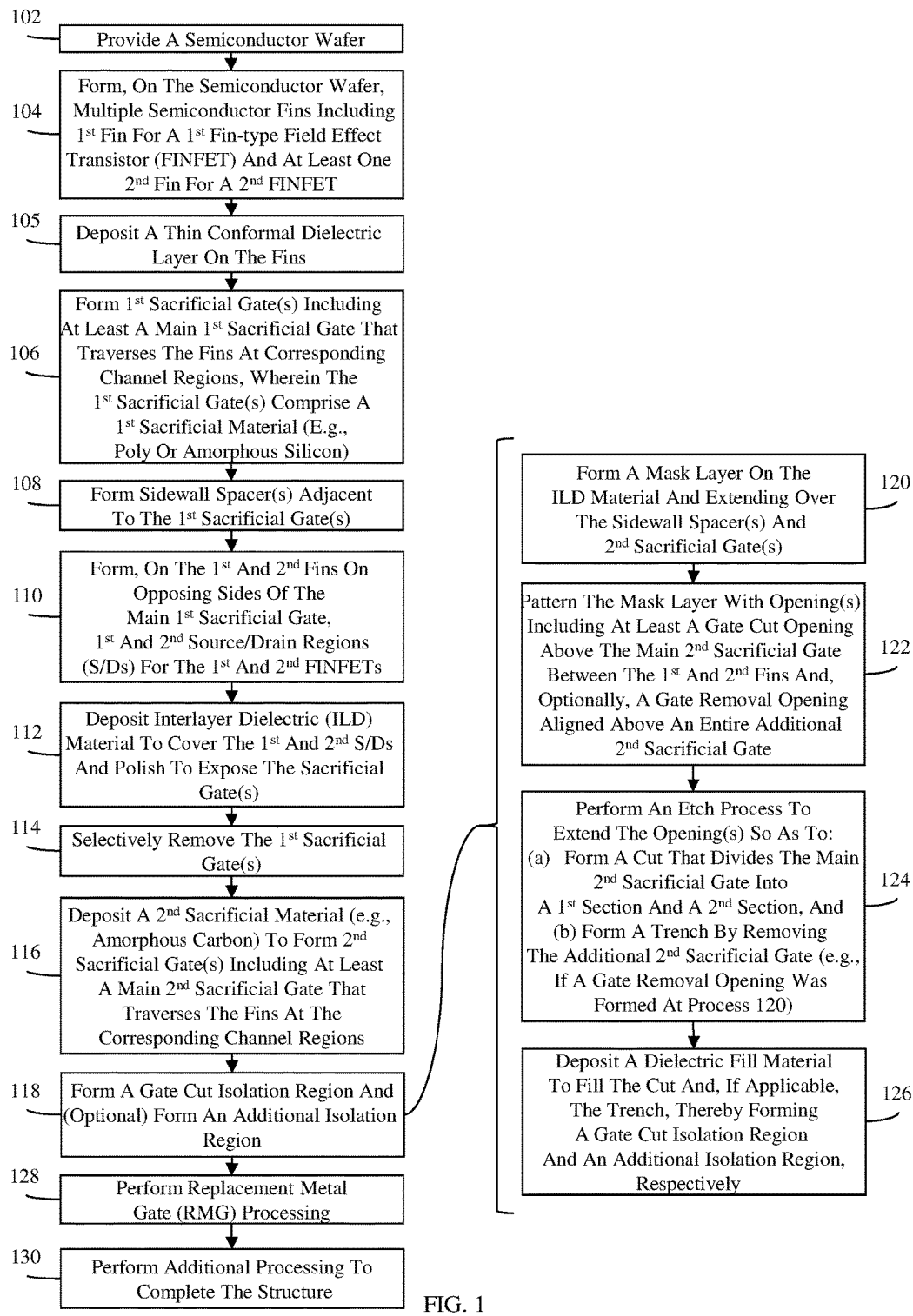
FIG. 1 is a flow diagram illustrating embodiments of a method for forming an integrated circuit (IC) structure that incorporates multiple field effect transistors (FETs) with replacement metal gates (RMGs) and a gate cut isolation region between the RMGs.

As mentioned above, an exemplary cell can incorporate multiple parallel semiconductor fins, including at least one first semiconductor fin with a first channel region and first source/drain regions for at least one first-type FINFET (e.g., a P-type FINFET) and at least one second semiconductor fin with a second channel region and second source/drain regions for at least one second-type FINFET (e.g., an N-type FINFET). A first gate (e.g., a first replacement metal gate (RMG)) can traverse the first semiconductor fin(s) at the first channel region and a second gate (e.g., a second replacement metal gate (RMG)) can be in end-to-end alignment with the first gate and can traverse the second semiconductor fin(s) at the second channel region. Depending upon the cell design, the first gate and the second gate can be physically separated and electrically isolated from each other by a gate cut isolation region, which is positioned laterally between the adjacent ends of the two gates in an area between the first semiconductor fin(s) and the second semiconductor fin(s).

The currently used techniques for forming such a cell with FINFETs having RMGs electrically and physically isolated from each other by a gate cut isolation region include the polysilicon design level (PC) cut first technique and the PC cut last technique. In the PC cut first technique the following processes can be performed: patterning polysilicon or amorphous silicon sacrificial gate structures with gate sidewalls spacers across the channel regions for two FINFETs, respectively, such that the sacrificial gate structures are in end to end alignment and such that a gate cut isolation region is between adjacent ends of the sacrificial gate structures; and then replacing the sacrificial gate structures with RMG structures for the two FINFETs. In the PC cut last technique the following processes can be performed: forming a single polysilicon or amorphous silicon sacrificial gate structure with a gate sidewall spacer that traverses the channel regions for two FINFETs; forming a gate cut isolation region within the sacrificial gate structure in an area between the two FINFETs to form two discrete sacrificial gate sections in end to end alignment and separated by the gate cut isolation region; and then replacing the sacrificial gate sections with RMG structures.

In the PC cut first technique, weak points are present in the partially completed structure and these weak points can lead to device fails. Specifically, near the gate cut isolation region, interfaces between the corners of the sacrificial gate structures and the gate sidewall spacers are weak points during epitaxial deposition of source/drain regions. Specifically, during epitaxial deposition of source/drain regions, nodules of epitaxial semiconductor material tend to grow at these interfaces and the nodules can result in a source-to-drain short.

The PC cut last technique avoids this issue because epitaxial deposition of the source/drain regions occurs prior to the formation of the gate cut isolation region. However, various disadvantages are also associated with the PC cut last technique.

Specifically, in the PC cut last technique, a hard mask layer (e.g., a silicon nitride hard mask layer) is formed over the sacrificial gate structure and then patterned so as to have an opening that defines a particular segment of the sacrificial gate structure within which the gate cut isolation region will be formed. The opening will typically be longer than the gate length of the sacrificial gate structure itself (e.g., as measured in a direction parallel to the semiconductor fins) such that interlayer dielectric (ILD) material (e.g., silicon dioxide or silane oxide) on one or both sides of the sacrificial gate structure is exposed. Although the etch processes performed to remove the particular segment of the sacrificial gate structure are optimally selective, anisotropic etch process, those skilled in the art will recognize that it can be difficult to selectively etch polysilicon or amorphous silicon over silicon dioxide or silane oxide without impacting the silicon dioxide or silane oxide surfaces. Thus, formation of a gate cut opening can result in recesses being formed in any exposed ILD material within the opening. When a dielectric fill material (e.g., a silicon nitride or silicon oxynitride) is subsequently deposited in order to form the gate cut isolation region, that dielectric fill material will also fill any adjacent recesses in the ILD material. Thus, the resulting gate cut isolation region will have a relatively wide upper portion that includes the dielectric-filled recesses and the ability to control the critical dimension of this gate cut isolation region is limited. Another ILD layer (e.g., silicon dioxide or silane oxide) is deposited above the dielectric fill material and three chemical mechanical polishing (CMP) processes are subsequently performed in order to expose the dielectric fill material, the hard mask layer and the sacrificial gate structures that are to be replaced by replacement metal gates. Thus, gate height control may be limited.

The inability to accurately control the critical dimension of the gate cut isolation region (e.g., due to the relatively wide upper portion) may make it so that the distance between the gate cut isolation region and an adjacent semiconductor fin is too small to ensure that subsequent processes can be properly performed. For example, to form RMGs, a conformal high-K gate dielectric layer can be deposited onto exposed channel regions of semiconductor fins in gate openings, which are positioned laterally adjacent to the gate cut isolation region and which are created by removal of the sacrificial gate sections. A high-K reliability anneal process can then be performed to improve the reliability of this high-K gate dielectric layer. To perform the high-K reliability anneal, a conformal sacrificial titanium nitride (TiN) layer can be deposited on the high-K gate dielectric layer and a sacrificial amorphous silicon layer can be deposited onto the sacrificial titanium nitride layer. A thermal anneal process can then be performed in order to modify the molecular structure of the high-K gate dielectric layer so as to improve its reliability (e.g., to minimize gate leakage, negative bias temperature instability, etc.). Following the thermal anneal, cleaning processes can be performed to completely remove the sacrificial amorphous silicon and titanium nitride layers. Subsequently, different stacks of gate conductor materials can be formed in the two gate openings to achieve different work functions. However, with continued size scaling, the gate openings created by removal of the sacrificial gate sections are now relatively small and, within each gate opening, the space between a semiconductor fin and the adjacent gate cut isolation region can be relatively narrow (particularly in the event of overlay errors). Thus, when the sacrificial amorphous silicon layer is deposited prior to the reliability anneal may, that sacrificial amorphous silicon layer may pinch-off prior to completely filling the space between the semiconductor fin and the adjacent gate cut isolation region, thereby creating a void. If such a void is created, an oxide coating can form on surfaces within the void during the reliability anneal. When present, such an oxide coating will prevent removal of any TiN residue and/or TiN silicide residue below during the cleaning processes performed after the thermal anneal and these residue(s) can, in turn, cause leakage issues, threshold voltage variation, etc. Another issue related to continued size scaling include the fact that the aspect ratio of the sacrificial gate structure may be so high that complete removal of a only a small segment of a polysilicon or amorphous silicon sacrificial gate structure to form a gate cut can be difficult. As a result, in the final structure, polysilicon or amorphous silicon may be found below the gate cut isolation region and may cause a short between RMGs that are formed on either side of the gate cut isolation region. Finally, as mentioned above, the use of so many CMP processes in the PC cut last technique can limit gate height control. Without accurate gate height control, achieving a targeted threshold voltage may not be possible.

In view of the foregoing, disclosed herein are embodiments of an improved method for forming an integrated circuit (IC) structure that incorporates multiple field effect transistors (FETs) (e.g., fin-type field effect transistors (FIN-FETs)) with replacement metal gates (RMGs) and a gate cut isolation region between the RMGs. The disclosed embodiments specifically include process steps designed to improve gate cut isolation region critical dimension control. In the embodiments, prior to RMG formation, an originally formed sacrificial gate, which is adjacent to a first channel region and a second channel region and which is made of a first sacrificial material (e.g., polysilicon or amorphous silicon), can be replaced with another sacrificial gate, which is made of a second sacrificial material (e.g., amorphous carbon) that is more selectively and anisotropically etchable than the first sacrificial material. A cut can be formed through this other sacrificial gate, thereby dividing it into a first section adjacent to the first channel region and a second section adjacent to the second channel region. The cut can then be filled with dielectric fill material to form the gate cut isolation region. The use of the second sacrificial material ensures that, when a gate cut opening in a mask pattern that is used to form the gate cut extends over the gate sidewall spacer or even the interlayer dielectric (ILD) material, recesses will not be formed within the gate sidewall spacer or ILD material. By avoiding the formation of such recesses that would subsequently be filled with the dielectric fill material, the embodiments effectively control the critical dimension of the gate cut isolation region.

More particularly, FIG. 1 is a flow diagram illustrating embodiments of an improved method for forming an integrated circuit (IC) structure that incorporates multiple field effect transistors (FETs) (e.g., fin-type field effect transistors (FINFETs)) with replacement metal gates (RMGs) and a gate cut isolation region between the RMGs.

Figure 2A:
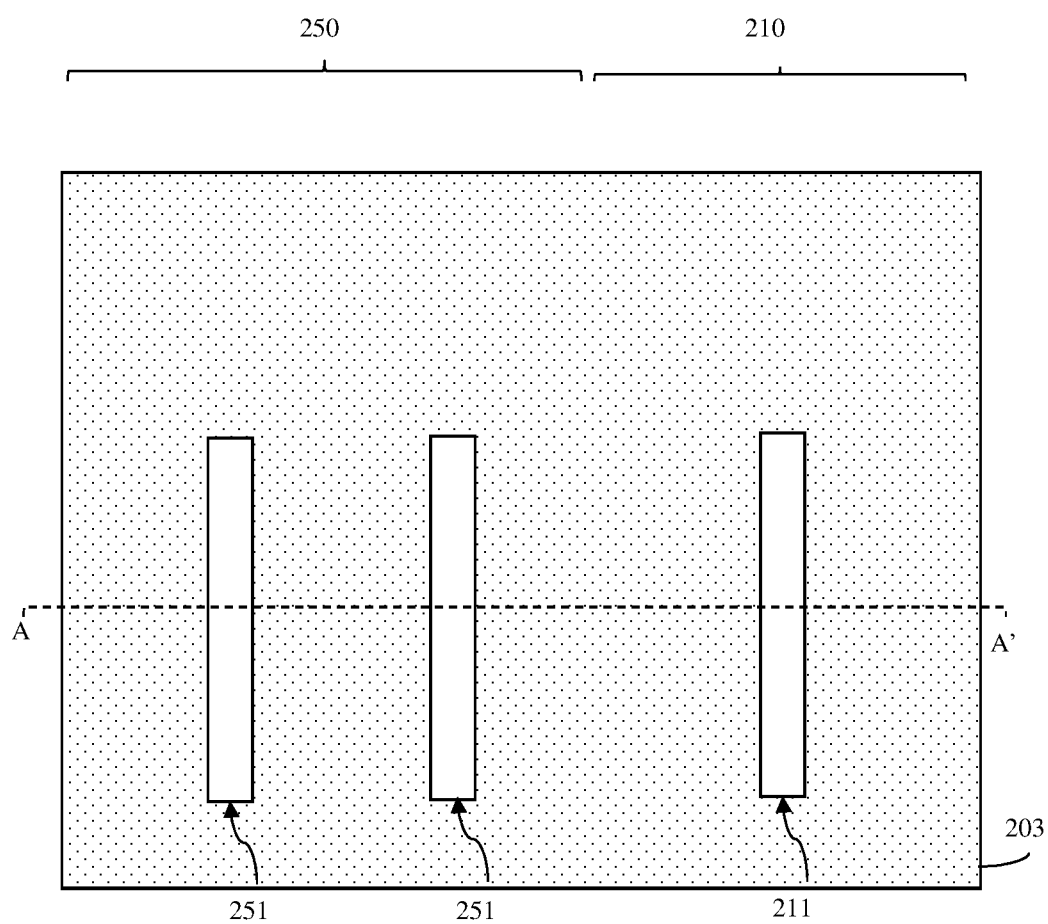
FIG. 2A is a top view and FIG. 2B is a cross-section diagram of a partially completed structure formed according to the flow diagram of FIG. 1.
Figure 2B:
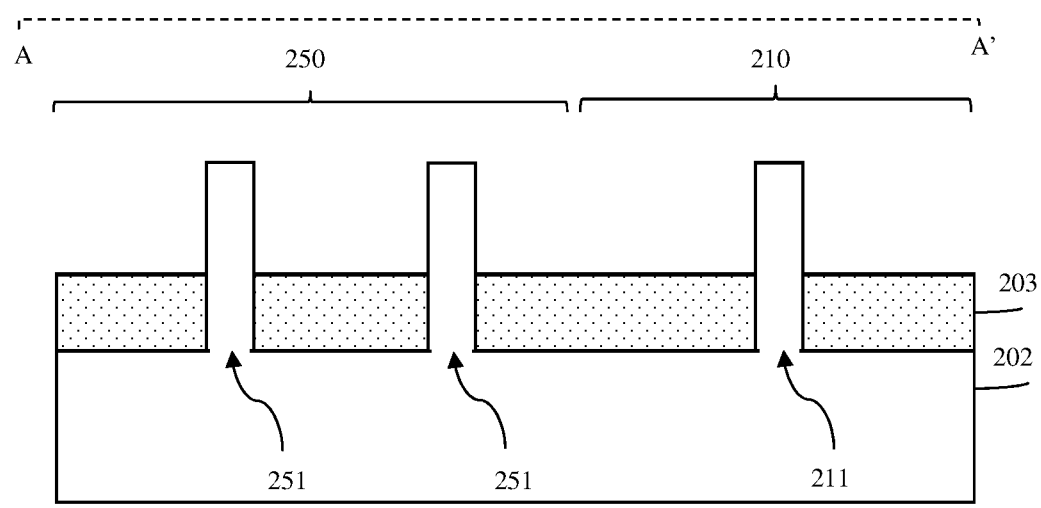

Specifically, this embodiment of the method includes providing a semiconductor wafer (see process 102) and forming a plurality of essentially parallel semiconductor fins for a plurality of FINFETs on the semiconductor wafer (see process 104). The semiconductor wafer provided at process 102 can be, for example, a bulk semiconductor wafer 202 (e.g., a bulk silicon wafer or other suitable bulk semiconductor wafer), as illustrated in FIGS. 2A-2B. Alternatively, a semiconductor-on-insulator wafer (e.g., a silicon-on-insulator (SOI) wafer) could be used. The FINFETs being formed can include, for example, a first FINFET 210 having a first-type conductivity (e.g., a P-type FINFET) in a first device region on the wafer and a second FINFET 250 having a second-type conductivity (e.g., an N-type FINFET) in a second device region on the wafer. Thus, the semiconductor fins formed at process 104 can include one or more first semiconductor fins 211 for the first FINFET 210 in the first device region and one or more second semiconductor fins 251 for the second FINFET 250 in a second device region, as shown in FIGS. 2A-2B.

For purposes of this disclosure, a semiconductor fin refers to a relatively tall and thin, elongated, essentially rectangular-shaped, semiconductor body. Additionally, for purposes of illustration, one first semiconductor fin 211 and two second semiconductor fins 251 are shown. However, it should be understood that the figures are not intended to be limiting and that one or more first semiconductor fins and one or more second semiconductor fins could, alternatively, be formed. Techniques for forming such semiconductor fins (e.g., lithographic patterning techniques, sidewall image transfer techniques, replacement fin techniques, etc.) are well known in the art and, thus, the details have been omitted from this specification in order to allow the reader to focus on the salient aspects of the disclosed method. During subsequent processing, different portions of the fins will be used to form different regions of the FINFETs. Specifically, first portions 212, 252 of the semiconductor fin 211, 251 will be used to form channel regions and second portions 213, 253 of the semiconductor fins 211, 251 on opposing sides of the channel regions 212, 252 will be used to form source/drain regions 213, 253, respectively. Optionally, each semiconductor fin 211, 251 can be doped, either before or after formation, so that its channel region will have appropriate type conductivity at a relatively low conductivity level. For example, for a P-type FINFET, each channel region can have an N− conductivity; whereas, for an N-type FINFET, each channel region can have a P− conductivity. Alternatively, the channel regions of the FINFETs can remain undoped.

It should be noted that if the semiconductor wafer on which the semiconductor fins 211, 251 are formed at process 104 is a bulk semiconductor wafer 202, as shown, an isolation layer 203 can be formed around the lower portion of each semiconductor fin 211, 251 and can extend laterally between adjacent semiconductor fins 211, 251. For example, silicon dioxide can be deposited over the semiconductor fins 211, 251 and recessed to form the isolation layer 203. If, however, the semiconductor wafer on which the semiconductor fins 211, 251 are formed at process 104 is an SOI wafer, the semiconductor fins 211, 251 can extend essentially vertically upward from the top surface of an insulator layer such that portions of the insulator layer function as an isolation layer extending laterally between adjacent semiconductor fins.

Figure 3A:
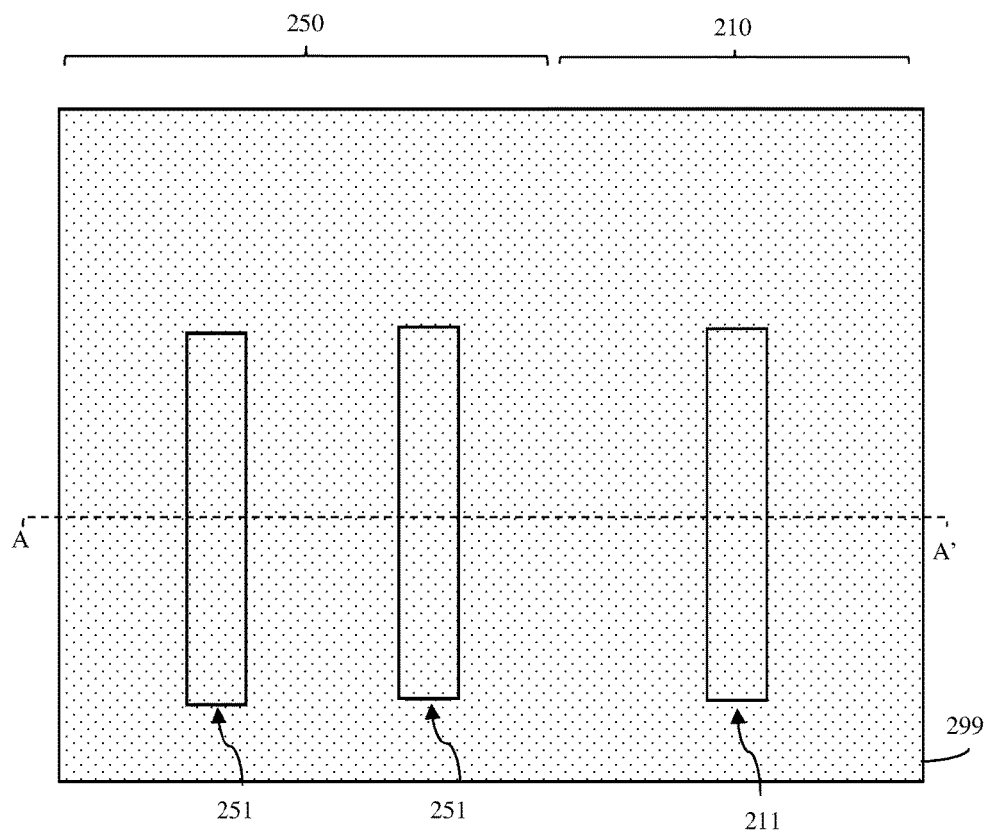
FIG. 3A is a top view and FIG. 3B is a cross-section diagram of a partially completed structure formed according to the flow diagram of FIG. 1.
Figure 3B:
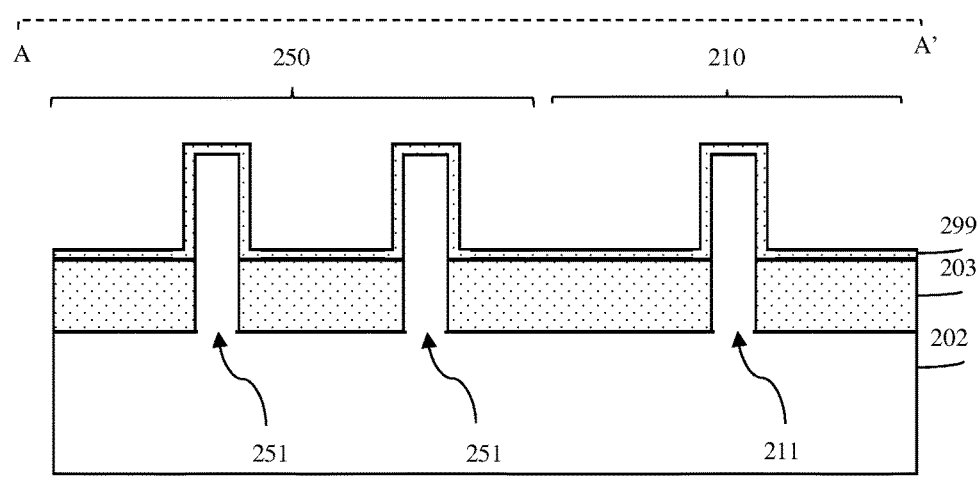

A relatively thin conformal dielectric layer 299 can be deposited so as to cover each of the semiconductor fins 211, 251. The thin conformal dielectric layer 299 can be, for example, a thin silicon dioxide layer (see process 105 and FIGS. 3A-3B).

Figure 4A:
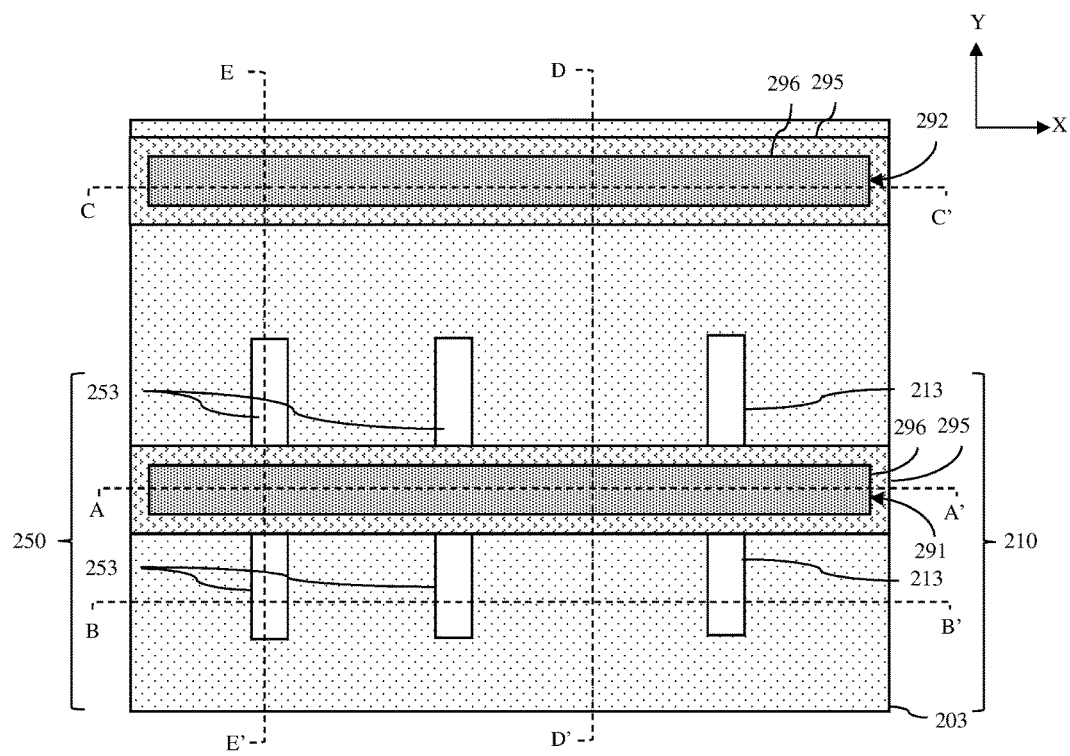
FIG. 4A is a top view diagram and FIGS. 4B-4F are different cross-section diagrams illustrating a partially completed structure formed according to the flow diagram of FIG. 1.
Figure 4B:
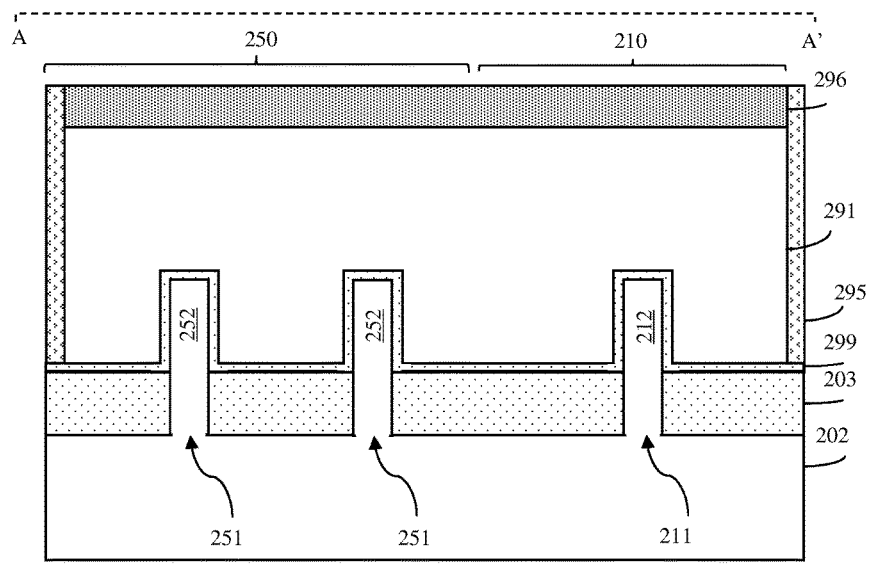
Figure 4C:
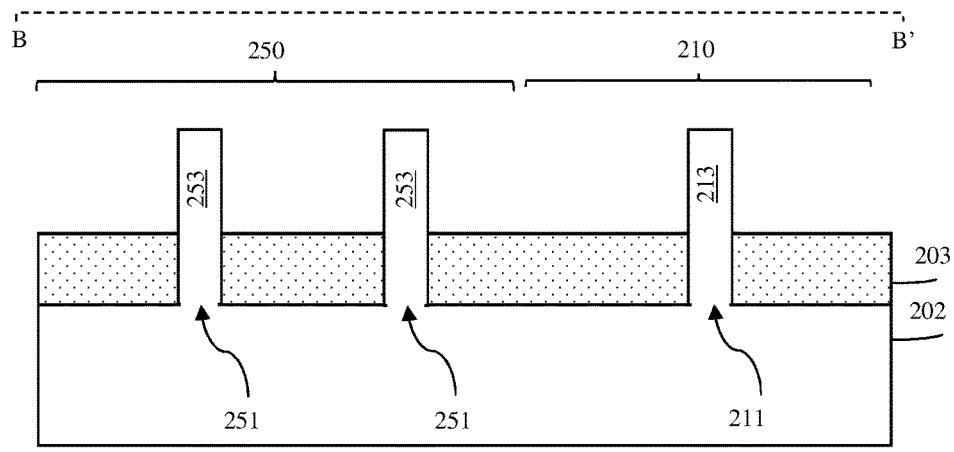
Figure 4D:
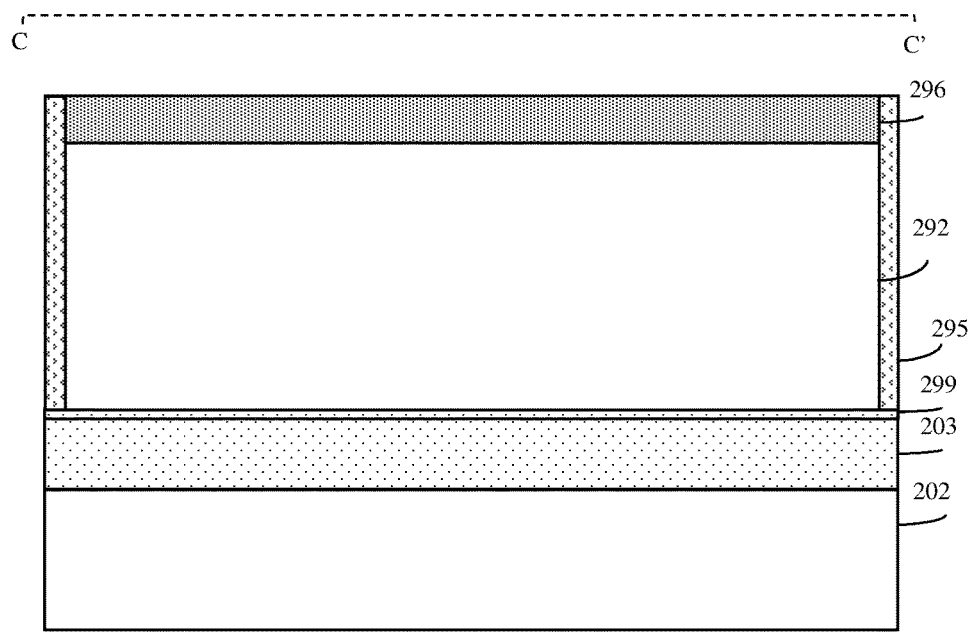
Figure 4E:
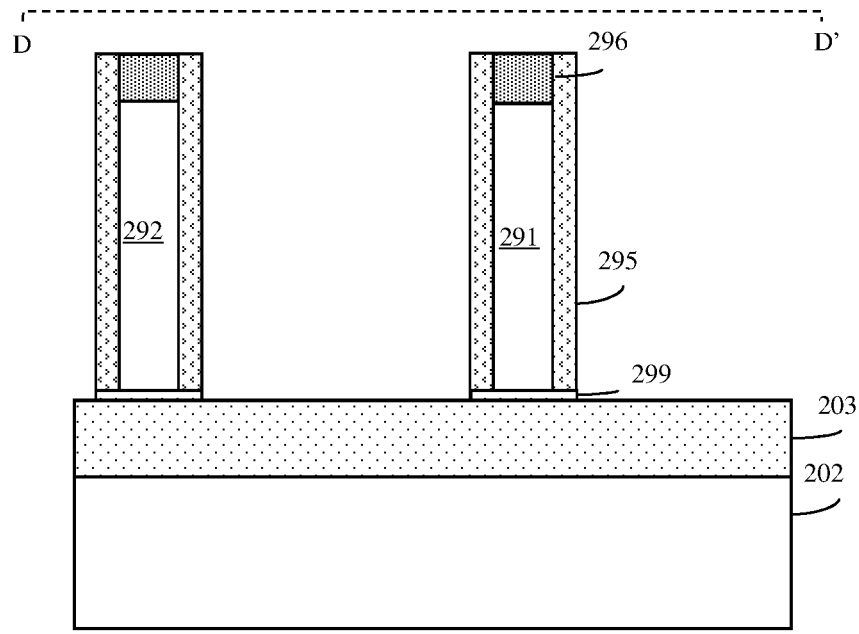
Figure 4F:
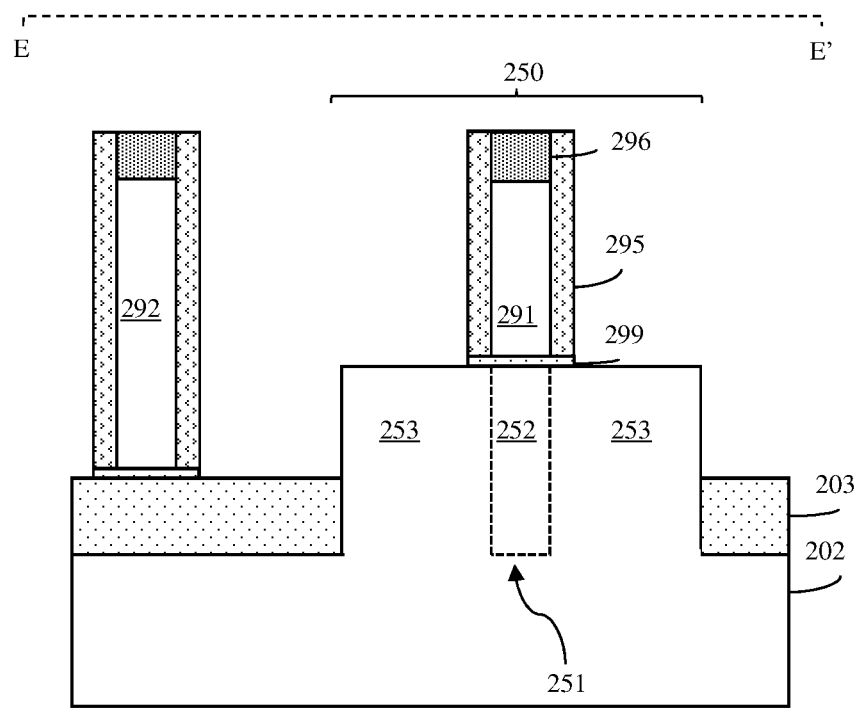

One or more first sacrificial gates, each with a sacrificial gate cap and a dielectric sidewall spacer, can then be formed on conformal dielectric layer so as to be essentially perpendicular to the semiconductor fins 211, 251 (see processes 106-108). FIG. 4A is a top view diagram of an exemplary partially completed structure following formation, at process 106, of two first sacrificial gates 291 and 292, each having a sacrificial dielectric gate cap 296 and a dielectric sidewall spacer 295. FIGS. 4B-4F are various cross-section diagrams of this same partially-completed structure.

It should be noted that, in the Figures, cross-sections A-A', B-B' and C-C' are parallel and oriented in the X-direction with the A-A' cross-section being a vertical cross-section cutting across the channel region 212, 252 of each semiconductor fin 211, 251, with the B-B' cross-section being a vertical cross-section cutting across source/drain regions 213, 253 of each semiconductor fin 211, 251, and with the C-C' cross-section being a vertical cross-section cutting across a portion of the wafer adjacent to, but physically separated from one end of the semiconductor fins. Additionally, cross-sections D-D' and E-E' are parallel and oriented in the Y-direction with the D-D' cross-section being a vertical cross-section cutting between the first semiconductor fin(s) 211 and the second semiconductor fin(s) 251 and with the E-E' cross-section being a vertical cross-section cutting across the length of an exemplary one of the second semiconductor fins 251. Subsequent process steps of the method will be shown in the Figures using a top view diagram and/or one or more of the above-mentioned cross-sections A-A' to E-E'.

For purposes of illustration, only two first sacrificial gates are shown in FIGS. 4A-4F, including a main first sacrificial gate 291 and an additional first sacrificial gate 292. The main first sacrificial gate 291 is formed so that it traverses first portions of the semiconductor fins 211, 251, thereby defining the locations of the channel regions 212, 252. The additional first sacrificial gate 292 is formed so that it is on the isolation layer 203 adjacent to, but physically separated from, one end of the semiconductor fins 211, 251. It should be understood that the Figures are not intended to be limiting. Alternatively, only the main first sacrificial gate 291 could be formed. Alternatively, the spaces between the first sacrificial gates could be reduced (i.e., the gate pitch could be reduced) such that additional first sacrificial gates traverse the semiconductor fins 211, 251 (e.g., at the ends of the semiconductor fins such that the source/drain regions 213, 253 extend between the main first sacrificial gate and adjacent additional first sacrificial gates).

In any case, to form the first sacrificial gates at process 106, a blanket layer of a first sacrificial material (e.g., polysilicon or amorphous) can be deposited on the conformal dielectric layer 299. A polishing process (e.g., a chemical mechanical polishing (CMP) process) can be performed to ensure that the top surface of the first sacrificial material is essentially planar. Then, a sacrificial dielectric gate cap layer (e.g., a layer of nitride, silicon boron carbon nitride or any other suitable dielectric gate cap material), which is different from the first sacrificial material, can be formed on the top surface of the first sacrificial material to form a sacrificial gate stack. The sacrificial gate stack can then be lithographically patterned and etched to form the first sacrificial gate(s) (e.g., 291 and 292), each having a sacrificial dielectric gate cap 296. Sidewall spacer(s) 295 can then be formed at process 108 on the sidewalls of the first sacrificial gate(s) 291 and 292 such that each sidewall spacer laterally surrounds and is immediately adjacent to a corresponding first sacrificial gate. The sidewall spacer(s) 295 can be formed, for example, using conventional sidewall spacer formation techniques. Such sidewall spacer formation techniques are well known in the art and, thus, the details of those techniques have been omitted from the specification in order to allow the reader to focus on the salient aspects of the disclosed method. In any case, the sidewall spacer(s) 295 can be made of silicon nitride, silicon carbon nitride, silicon boron carbon nitride or any other suitable sidewall spacer material that is different from the first sacrificial material used for the first sacrificial gate(s) 291 and 292. It should be noted that, during formation of the first sacrificial gate(s) or the sidewalls spacer(s) thereon, portions of the conformal dielectric layer 299 that are protected by the gate(s) and sidewall spacer(s) can be etched away, thereby exposing the second portions of the semiconductor fins that extend laterally beyond the gate(s) and sidewall spacer(s).

Figure 5:
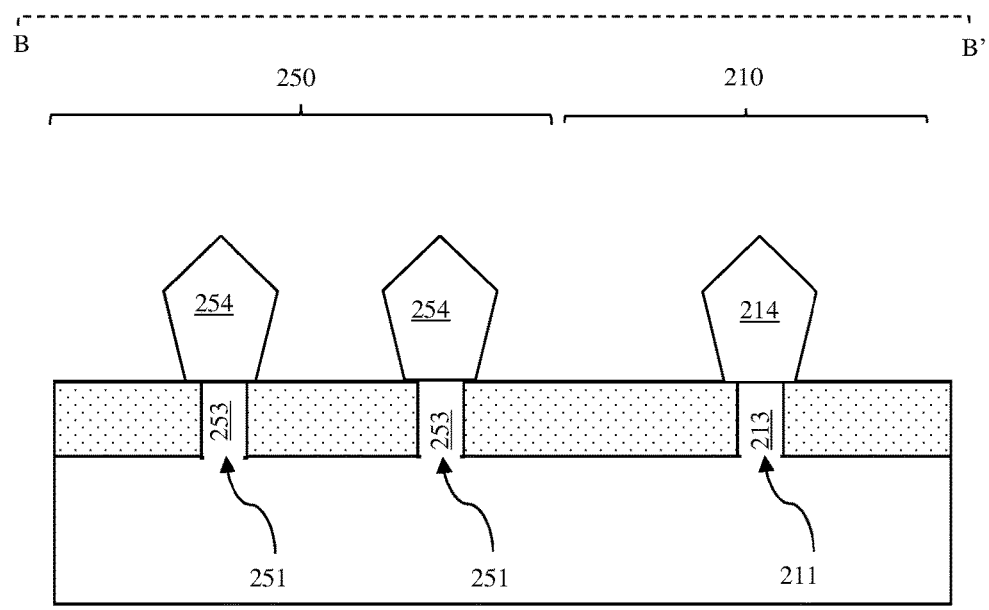
FIG. 5 is a cross-section diagram of a partially completed structure formed according to the flow diagram of FIG. 1.

First source/drain regions 213 and second source/drain regions 253 for the first FINFET 210 and second FINFET 250, respectively, can be formed using the exposed second portions of both the first semiconductor fin(s) 211 and the second semiconductor fin(s) 251 that extend laterally beyond the main first sacrificial gate 291 and its adjacent sidewall spacer 295 such that the first channel region(s) 212 is/are positioned laterally between first source/drain regions 213 and the second channel region(s) 252 is/are positioned laterally between second source/drain regions 253 (see process 110 and FIG. 5). For example, a masked dopant implantation process can be performed to dope the first source/drain regions 213 of the first FINFET 210, which will have the first-type conductivity, with a first dopant so that they have the first-type conductivity at a relatively high conductivity level (e.g., P+ conductivity for a P-type FINFET). Another masked dopant implantation process can be performed to dope the second source/drain regions 253 of the second FINFET 250, which will have the second-type conductivity, with a second dopant so that they have the second-type conductivity at a relatively high conductivity level (e.g., N+ conductivity for an N-type FINFET). Additionally or alternatively, epitaxial semiconductor materials can be deposited on the exposed second portions of both the first semiconductor fin(s) 211 and second semiconductor fin(s) 251 that extend laterally beyond the main first sacrificial gate 291 and its adjacent sidewall spacer 295 to form first epitaxial portions 214 of the first source/drain regions 213 and second epitaxial portions 254 of the second source/drain regions 253. The epitaxial semiconductor material can be in-situ doped or subsequently implanted to achieve the desired conductivity. Optionally, recesses can be formed in the source/drain regions 213, 253 of each semiconductor fins 211, 251 prior to deposition of epitaxial semiconductor material.

It should be noted that the epitaxial semiconductor material described above can be the same semiconductor material as that used for the semiconductor fins (e.g., silicon). Alternatively, the epitaxial semiconductor material may be different for the different FINFETs and specifically can be preselected for optimal device performance. For example, for a P-type FINFET, the epitaxial semiconductor material 214 could be silicon germanium (SiGe), which will enhance majority charge carrier mobility within the P-type FINFET's channel region and, thereby enhance performance. For an N-type FINFET, the epitaxial semiconductor material 254 could be silicon carbide (SiC), which will enhance majority charge carrier mobility within the N-type FINFET's channel region and, thereby enhance performance.

Figure 6A:
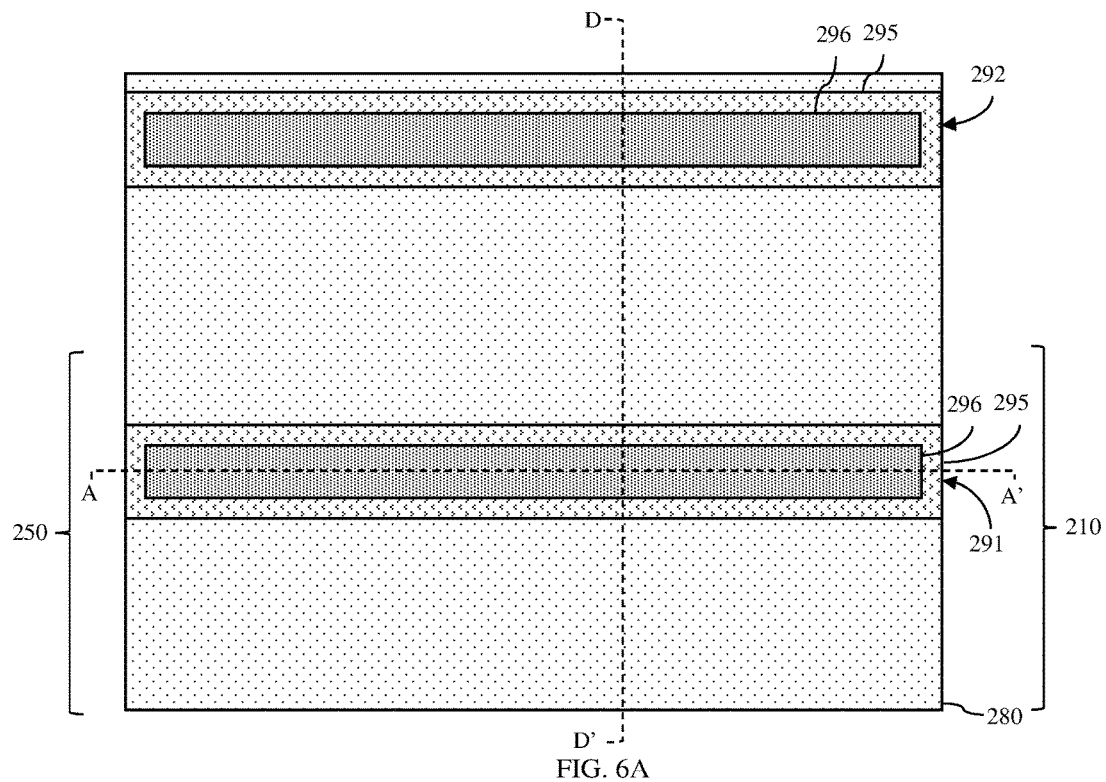
FIG. 6A is a top view and FIG. 6B is a cross-section diagram of a partially completed structure formed according to the flow diagram of FIG. 1.
Figure 6B:
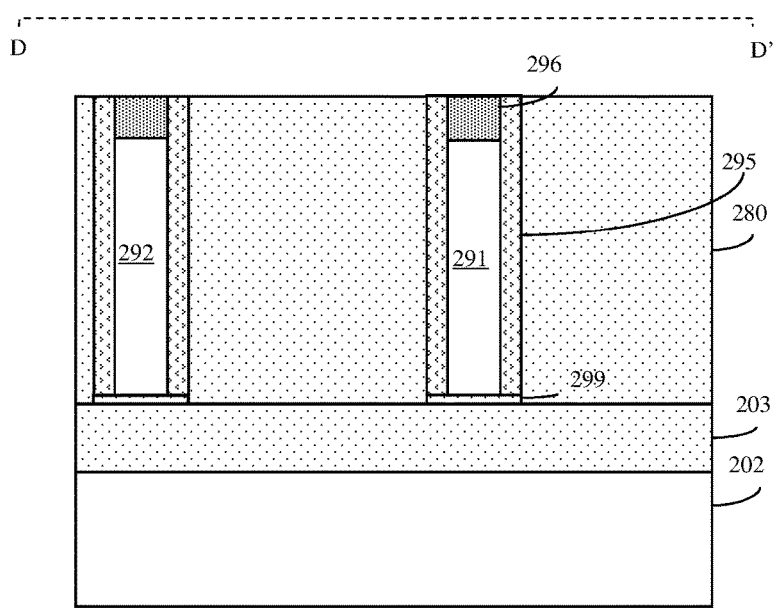
Figure 7A:
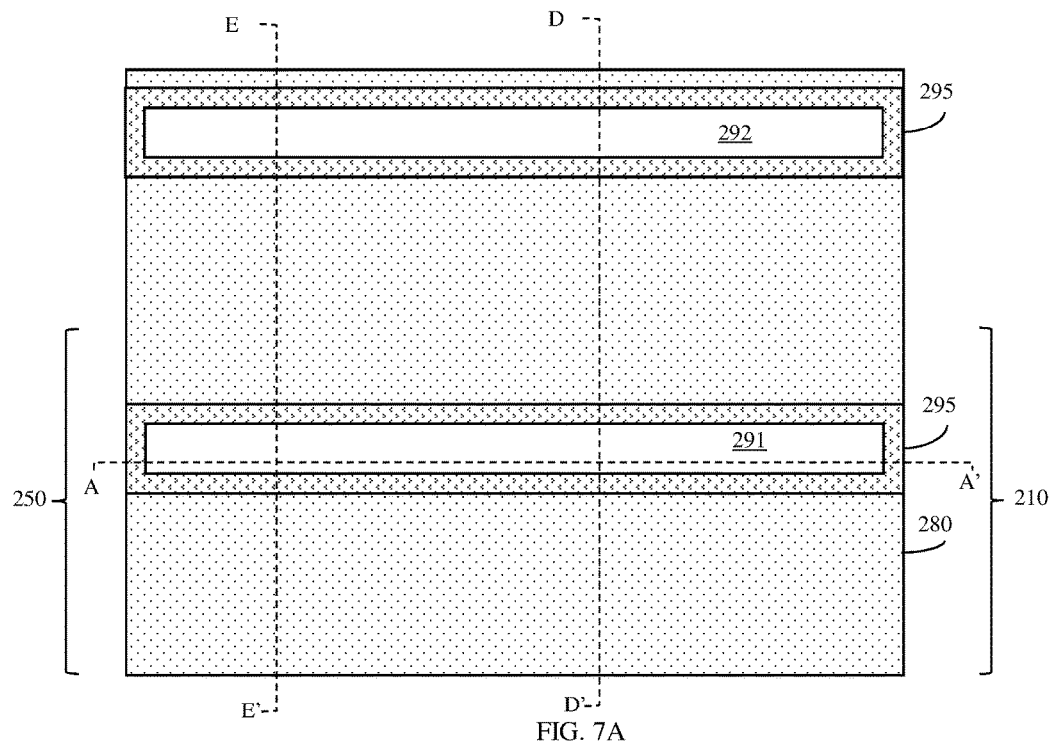
FIG. 7A is a top view diagram and FIGS. 7B-7D are different cross-section diagrams illustrating a partially completed structure formed according to the flow diagram of FIG. 1.
Figure 7B:
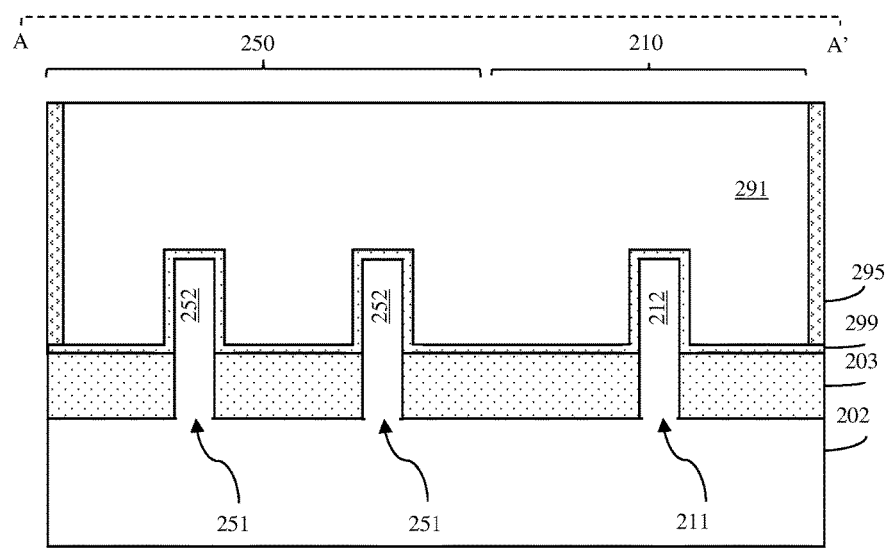
Figure 7C:
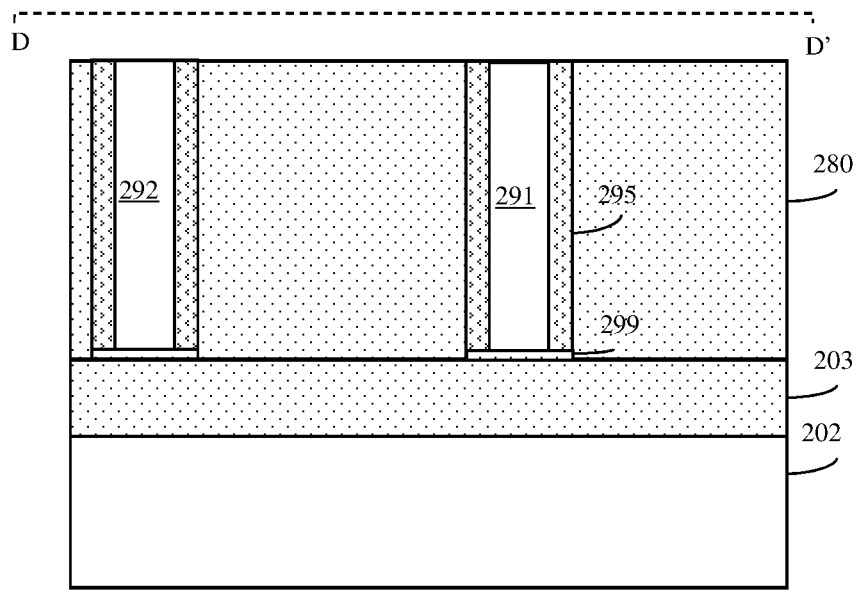
Figure 7D:
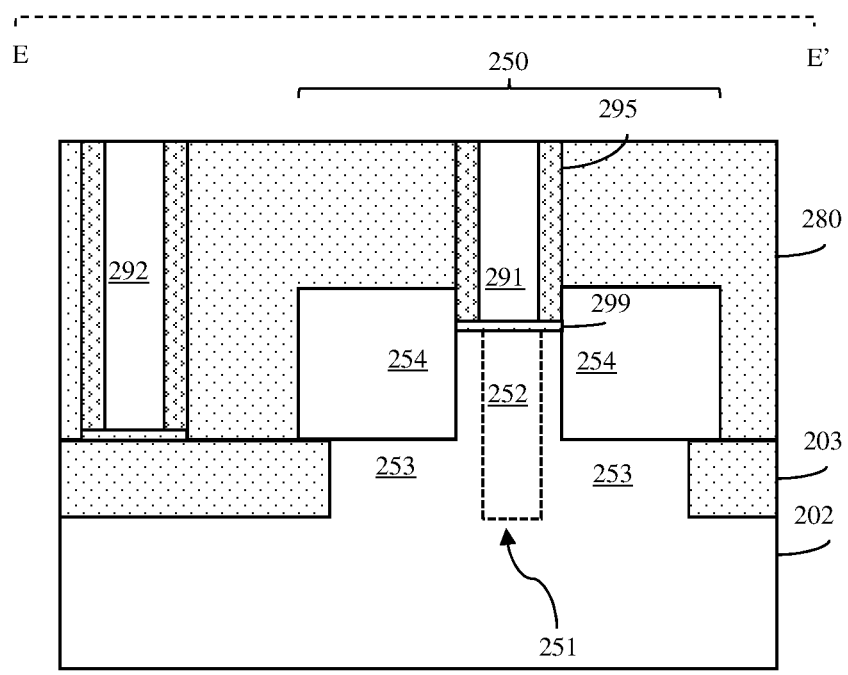
Figure 8A:
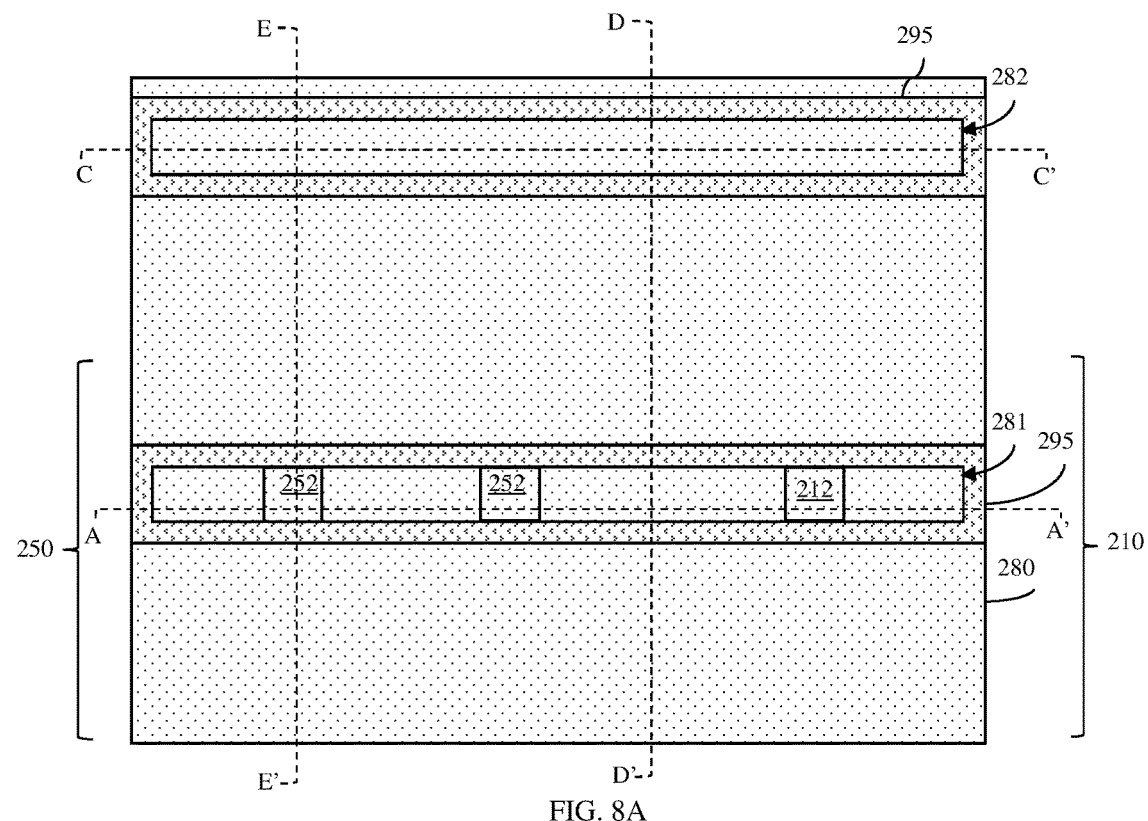
FIG. 8A is a top view diagram and FIGS. 8B-8E are different cross-section diagrams illustrating a partially completed structure formed according to the flow diagram of FIG. 1.
Figure 8B:
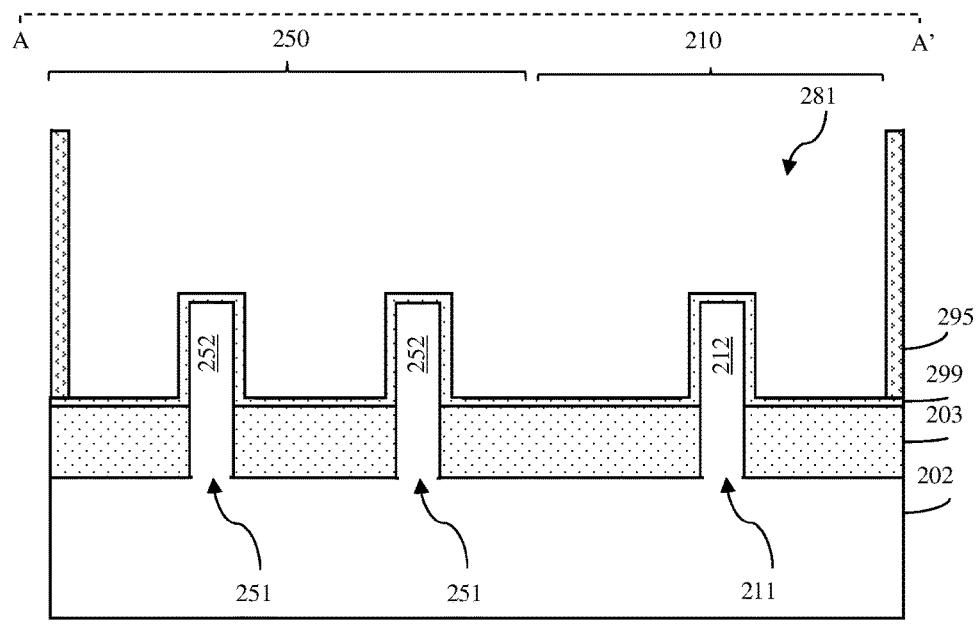
Figure 8C:
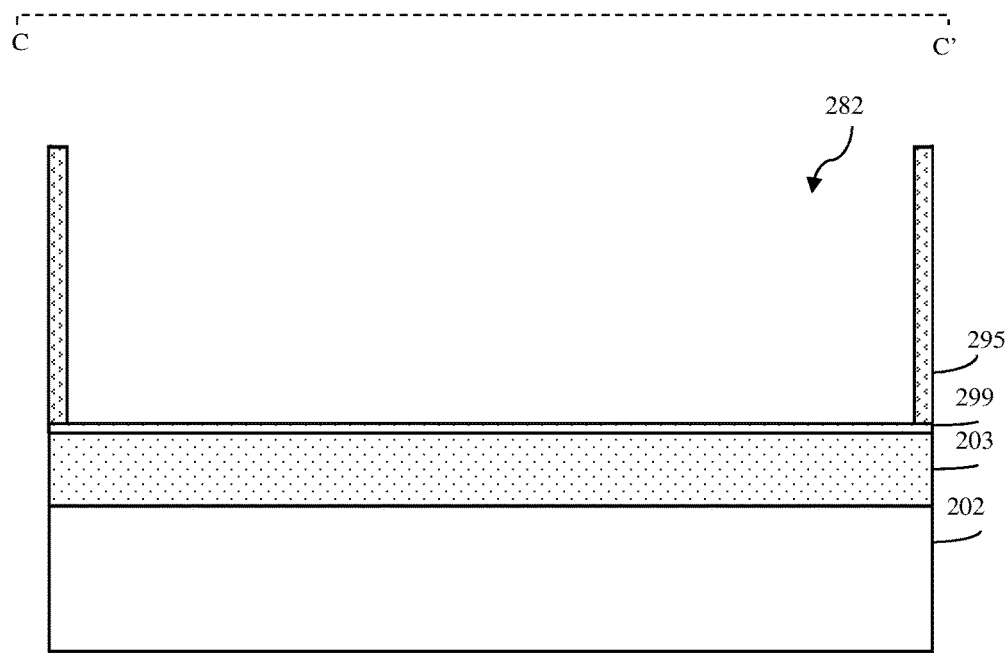
Figure 8D:
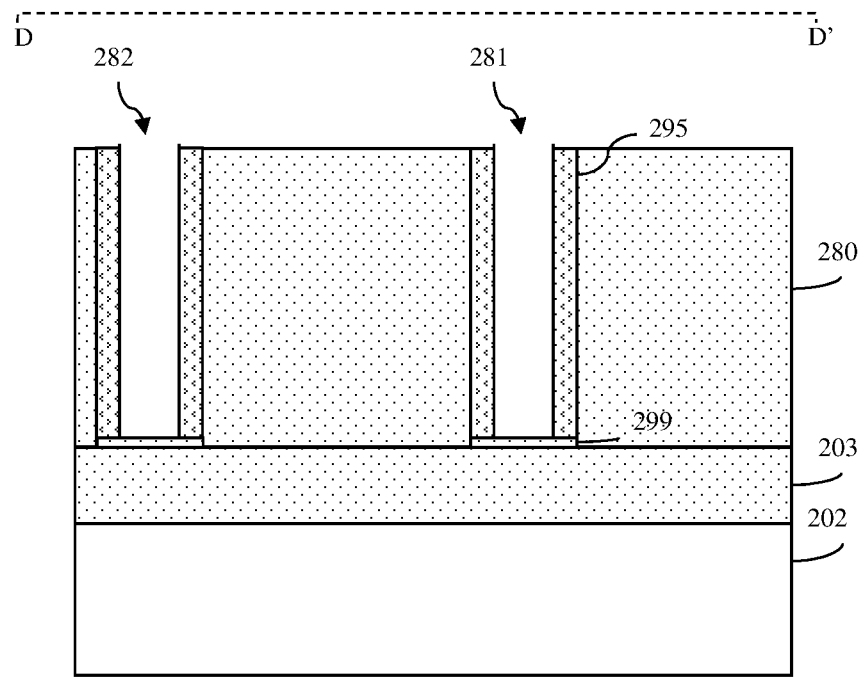
Figure 8E:
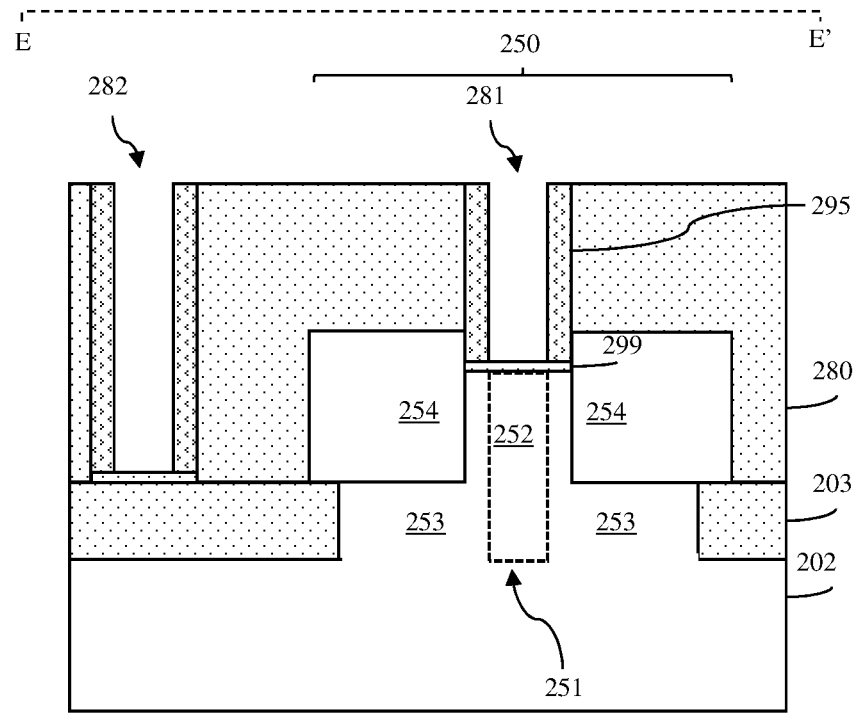
Figure 9A:
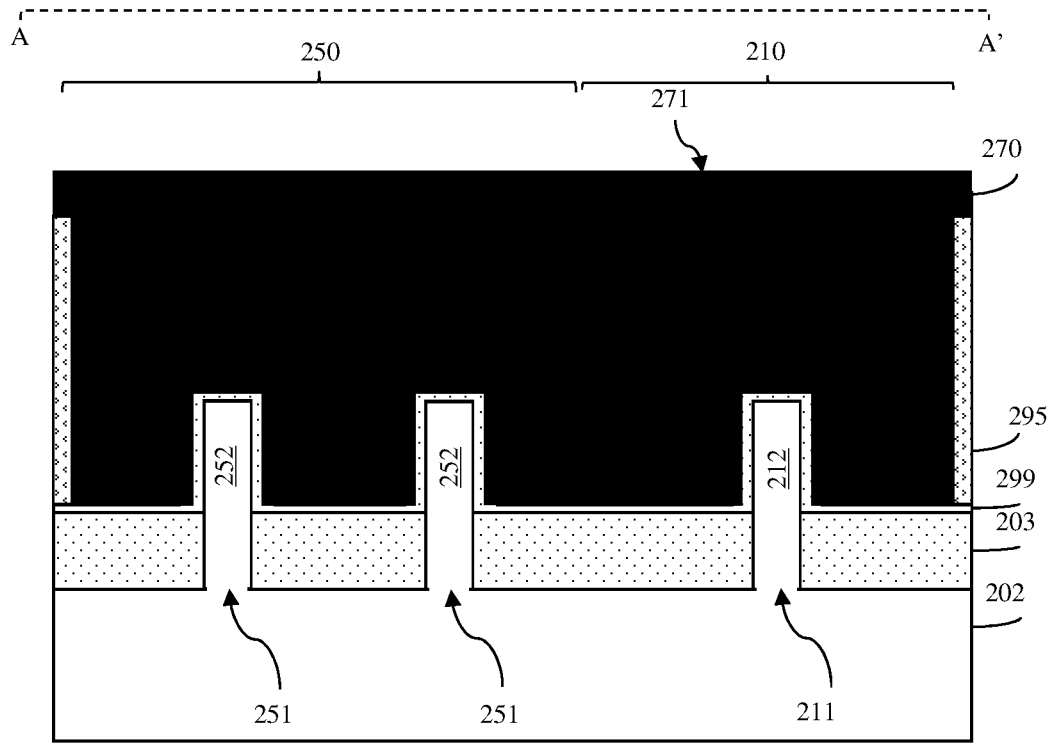
FIGS. 9A-9D are different cross-section diagrams illustrating a partially completed structure formed according to the flow diagram of FIG. 1.
Figure 9B:
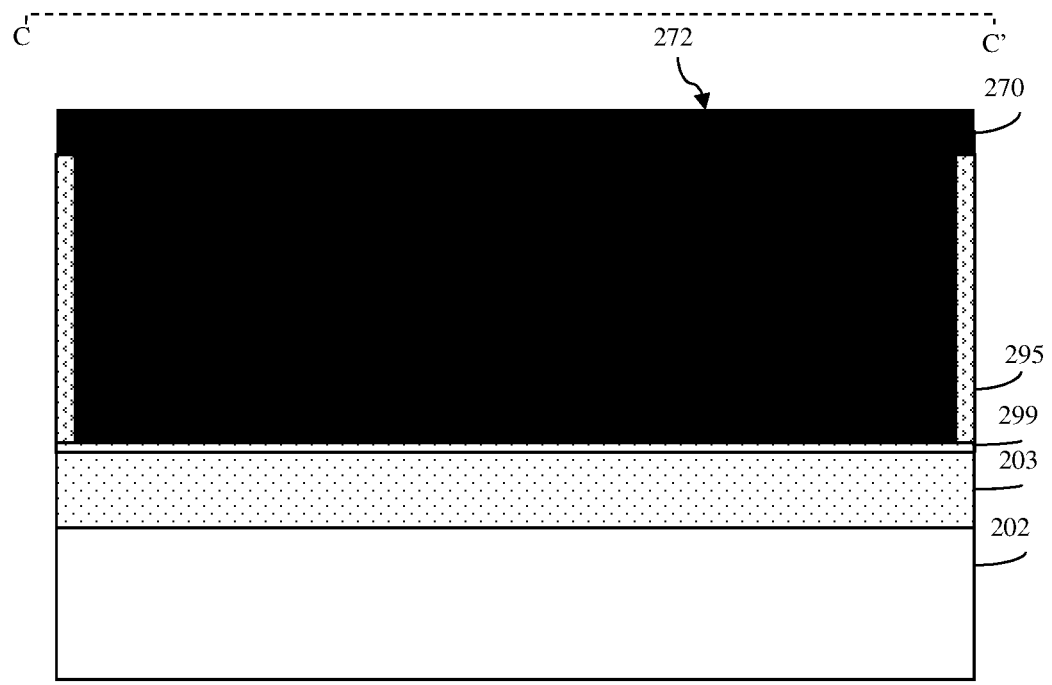
Figure 9C:
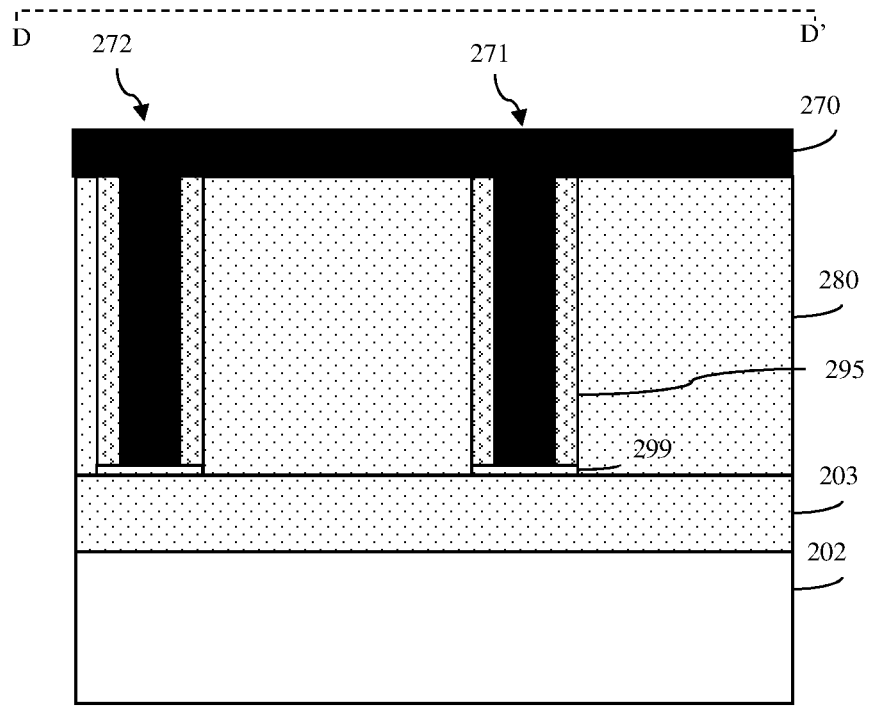
Figure 9D:
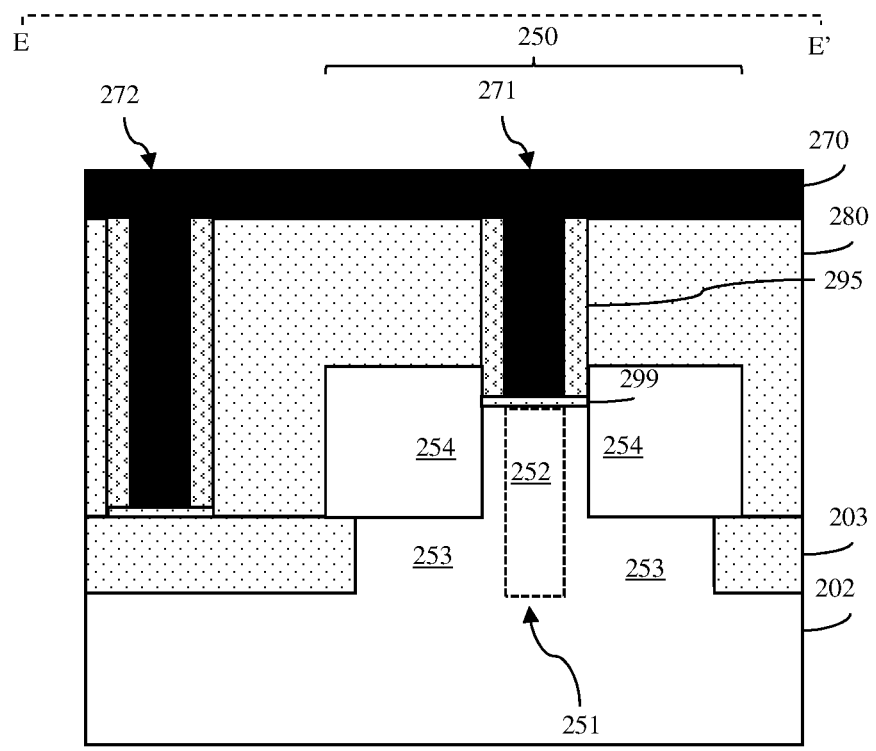

Interlayer dielectric (ILD) material 280 can then be deposited over the partially completed structure (see process 112 and FIGS. 6A-6B). The ILD material 280 can include one or more layers of silicon dioxide, silane oxide or some other suitable interlayer dielectric (ILD) material, such as borophosphosilicate glass (BPSG), tetraethyl orthosilicate (TEOS), fluorinated tetraethyl orthosilicate (FTEOS), etc. As illustrated, the ILD material 280 can cover the first source/drain regions 213 (including the first epitaxial portion 214, if present) of the first FINFET 210 and the second source/drain regions 253 (including the second epitaxial portion 254, if present) of the second FINFET 250, can fill the spaces between adjacent source/drain regions and can further fill the spaces around and between adjacent sacrificial gates. Next, a polishing process (e.g., a chemical mechanical polishing (CMP) process) can be performed in order to expose the top surfaces of the first sacrificial gate(s) 291 and 292, as shown in FIGS. 7A-7D.

The first sacrificial gate(s) can then be selectively removed, thereby forming preliminary gate opening(s) (see process 114 and FIGS. 8A-8E). For example, in the exemplary embodiment shown in the Figures, the main first sacrificial gate 291 and the additional first sacrificial gate 292 can each be selectively removed to form preliminary gate openings 281 and 282, respectively. Specifically, the first sacrificial material (e.g., polysilicon or amorphous silicon of the main first sacrificial gate 291 and the additional first sacrificial gate 292) can be selectively etched over the dielectric material of the conformal dielectric layer 299 (e.g., over silicon dioxide) as well as over the adjacent dielectric materials of the sidewall spacers 295 and the ILD material 280, thereby creating the preliminary gate openings 281 and 282, respectively. For example, a selective wet chemical etch process, such as a tetramethylammonium hydroxide (TMAH) wet chemical etch process can be used to selectively etch polysilicon or amorphous silicon over the various dielectric material. Alternatively, any other suitable selective etch process could be used. It should be noted that, since the main first sacrificial gate 291 was previously formed on portions of the conformal dielectric layer 299 adjacent to the top surface and opposing sides of the semiconductor fins 211, 251 at the channel regions 212, 252, the preliminary gate opening 281 will expose those portions of the conformal dielectric layer 299 adjacent to the top surface and opposing sides of the semiconductor fins 211, 251 at the channel regions 212, 252. In any case, each preliminary gate opening 281, 282 will have sidewalls lined with a sidewall spacer 295.

Thus, in the method embodiments disclosed herein, the main first sacrificial gate 291, which is made of the first sacrificial material (e.g., polysilicon or amorphous silicon), is selectively removed in its entirety prior to the formation of a gate cut isolation region. However, instead of immediately forming a replacement metal gate, having different sections with different work functions, in the opening 281 and then forming a gate cut isolation region between the different sections, the method embodiments disclosed herein instead form a second sacrificial gate in each preliminary gate opening. Specifically, a second sacrificial material 270 (e.g., amorphous carbon), which is different from the first sacrificial material and, more specifically, which is more selectively and anisotropically etchable over the dielectric materials used (e.g., silicon dioxide, etc.) than the first sacrificial material, can be deposited onto the ILD material 280 and into each preliminary gate opening, thereby replacing the first sacrificial gates with second sacrificial gates (see process 116).

For purposes of this disclosure, selective etching refers to etching one specific material without impacting one or more different materials exposed during the etch process or, at least, etching the one specific material at a significantly faster rate than the one or more different materials exposed during the etch process. A specific material is more selectively etchable than another material, if, given the available etch chemistries and techniques, etching of that specific material will have less of an impact on the one or more different materials exposed during the etch process as compared to the other material. Additionally, for purposes of this disclosure, anisotropic etching refers to etching in a single direction (i.e., in a direction that is essentially perpendicular to the substrate) or, at least, etching at a significantly faster rate in that direction as compared to other directions. Isotropic etching refer to etching at essentially the same rate in all directions. A specific material is more anisotropically etchable than another material, if, given the available etch chemistries and techniques, a higher ratio of the etch rate in the single direction to the etch rate in other directions can be achieved for the specific material as compared to the other material.

Amorphous carbon can be deposited using any of various known techniques (e.g., chemical vapor deposition (CVD), plasma enhanced CVD, or any other suitable deposition technique that can be used to fill the preliminary gate openings. Thus, for example, as shown in FIGS. 9A-9D, the second sacrificial material 270 can be deposited into the preliminary gate opening 281 and the additional preliminary gate opening 282 to form a main second sacrificial gate 271 and an additional second sacrificial gate 272, respectively. The main second sacrificial gate 271, which replaces the main first sacrificial gate 291, will traverse the first channel region(s) 212 of the first FINFET 210 and also the second channel region(s) 252 of the second FINFET 250. The additional second sacrificial gate 272 will replace the additional first sacrificial gate 292.

After formation of the second sacrificial gate(s), a gate cut isolation region can be formed within the main second sacrificial gate 271 and, optionally, an additional second sacrificial gate (e.g., the additional second sacrificial gate 272) can be removed, in its entirety, to create a trench and an additional isolation region can be formed within that trench (see process 118). More specifically, a mask layer 279 (e.g., a silicon nitride mask layer, a silicon dioxide mask layer, a silicon oxynitride mask layer or any other suitable mask layer) can be formed over the partially completed structure and, particularly, on the top surface of the second sacrificial material 270 (see process 120). The mask layer 279 can then be patterned (e.g., using conventional lithographic patterning and etch processes) so as to have a gate cut opening 275 and, optionally, a gate removal opening 276 (see process 122 and FIGS. 10A-10E).

Figure 10A:
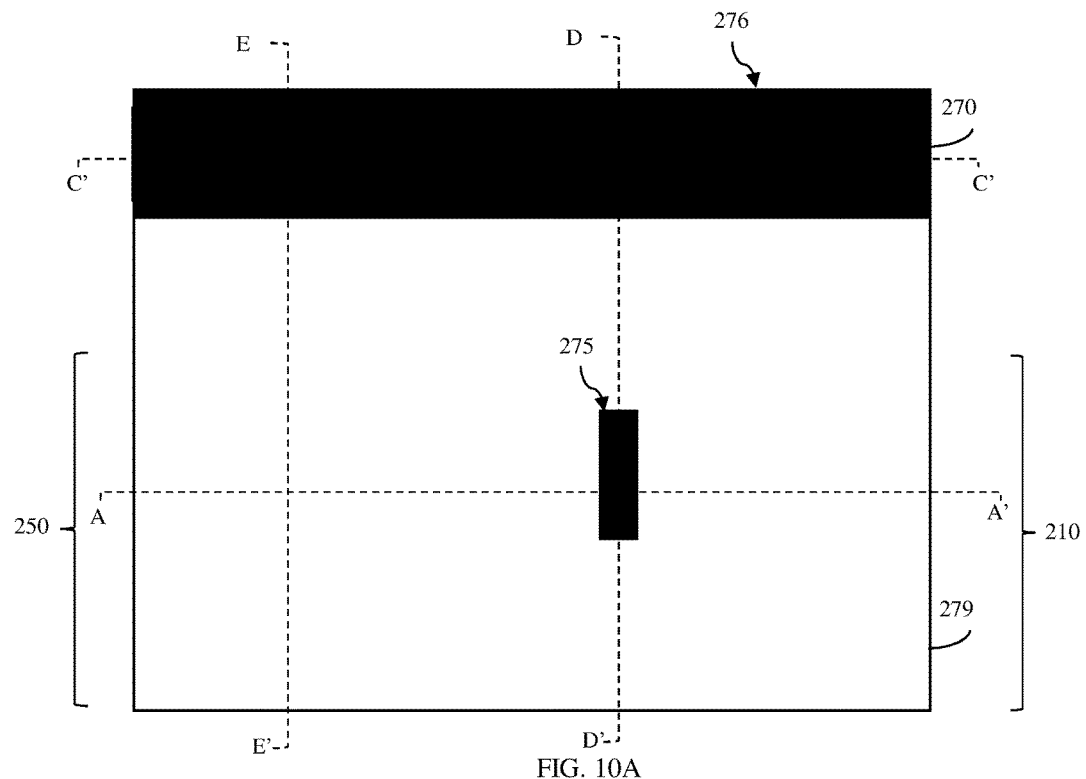
FIG. 10A is a top view diagram and FIGS. 10B-10E are different cross-section diagrams illustrating a partially completed structure formed according to the flow diagram of FIG. 1.
Figure 10B:
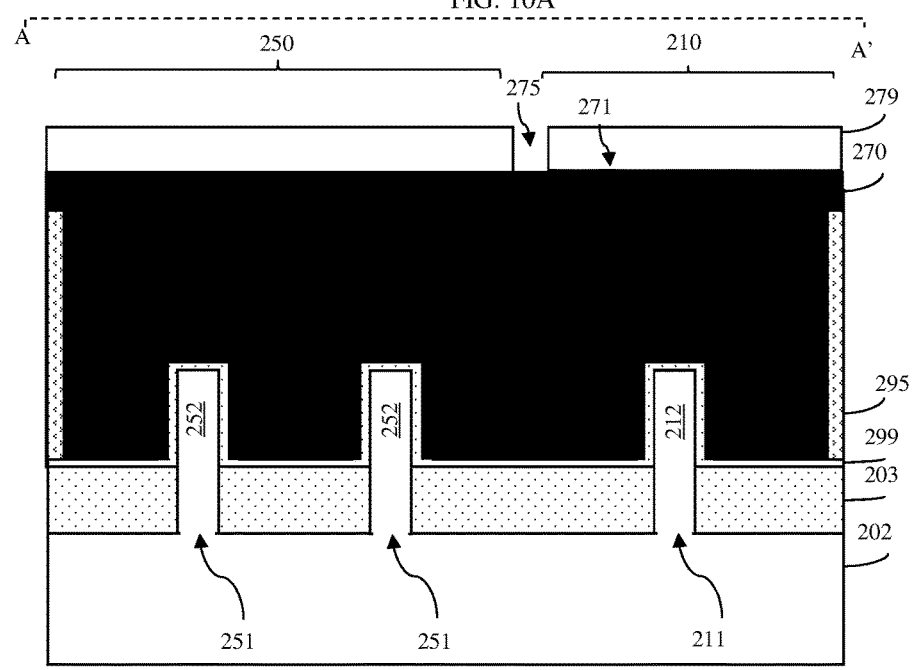
Figure 10C:
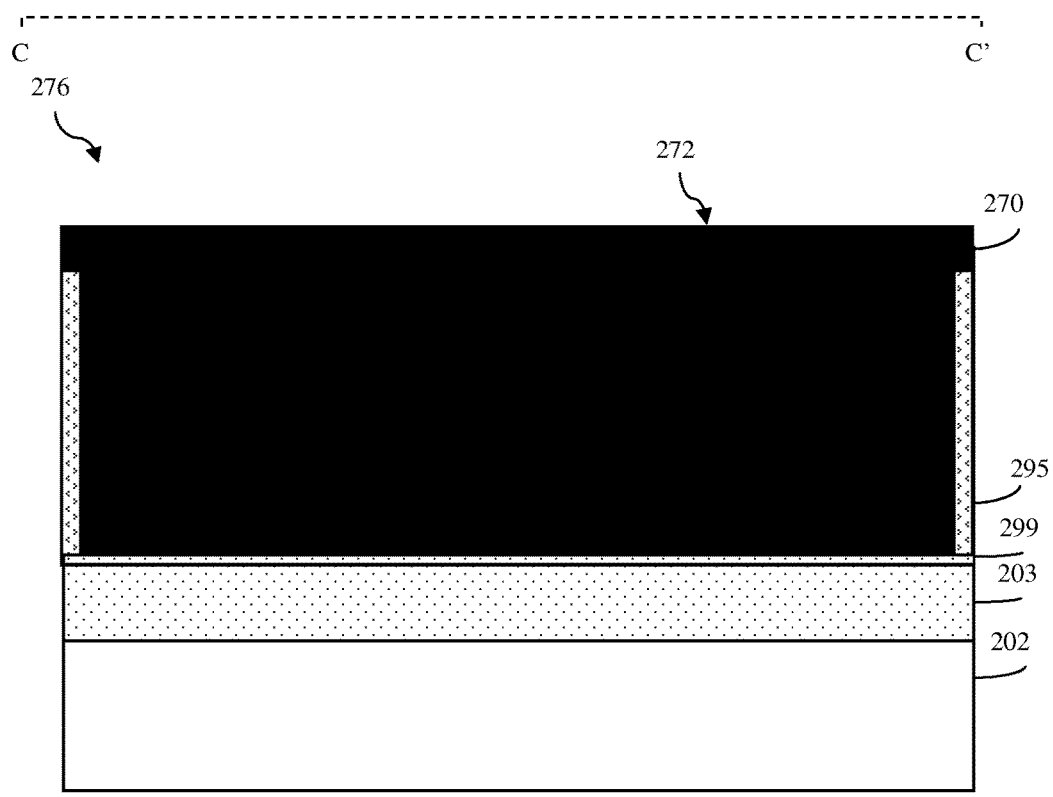
Figure 10D:
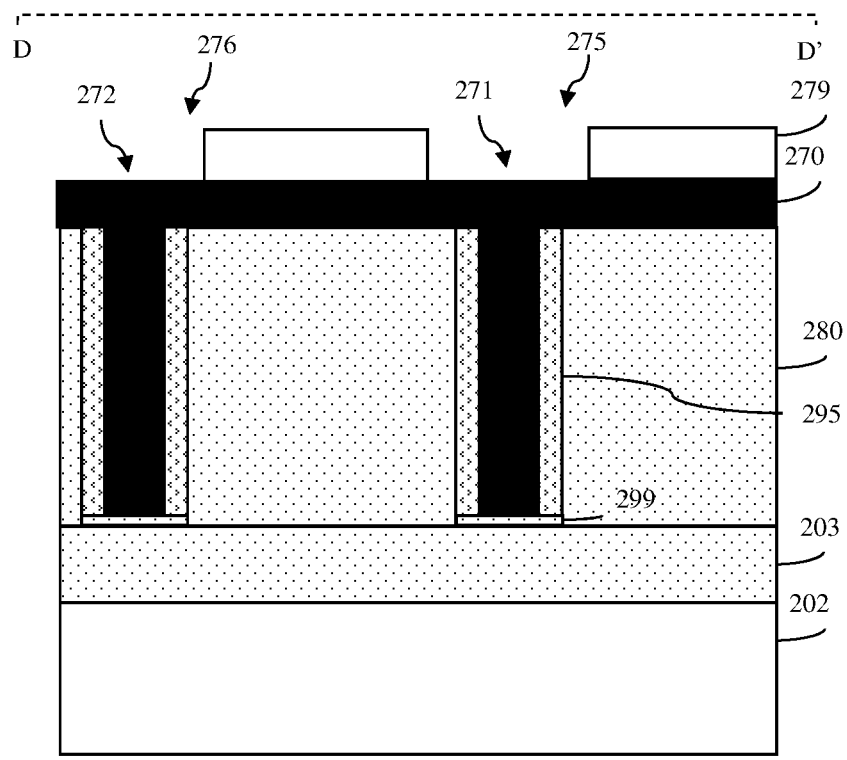
Figure 10E:
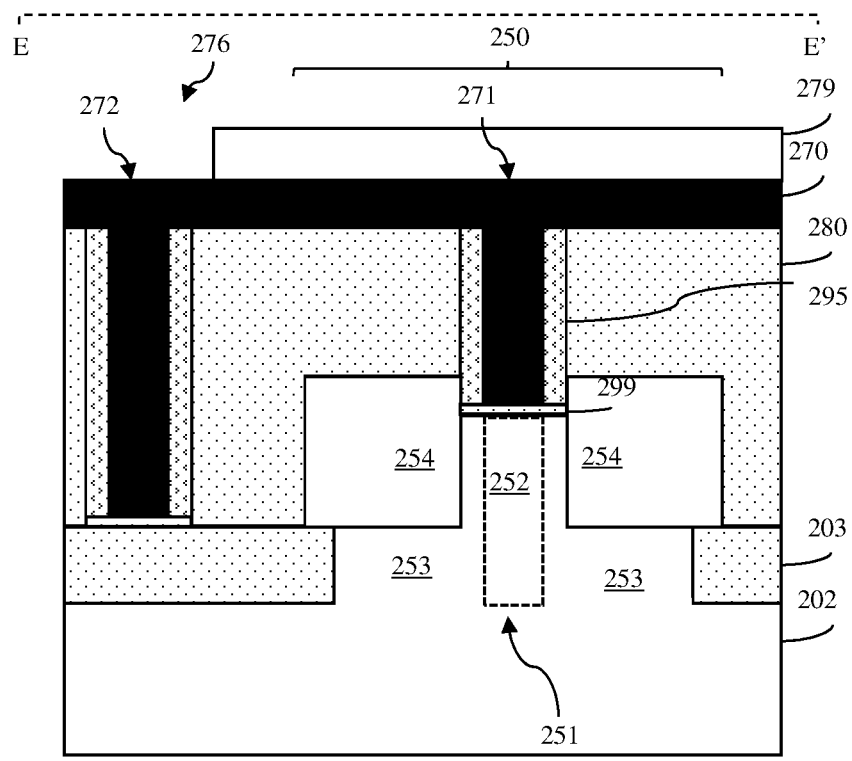
Figure 11A:
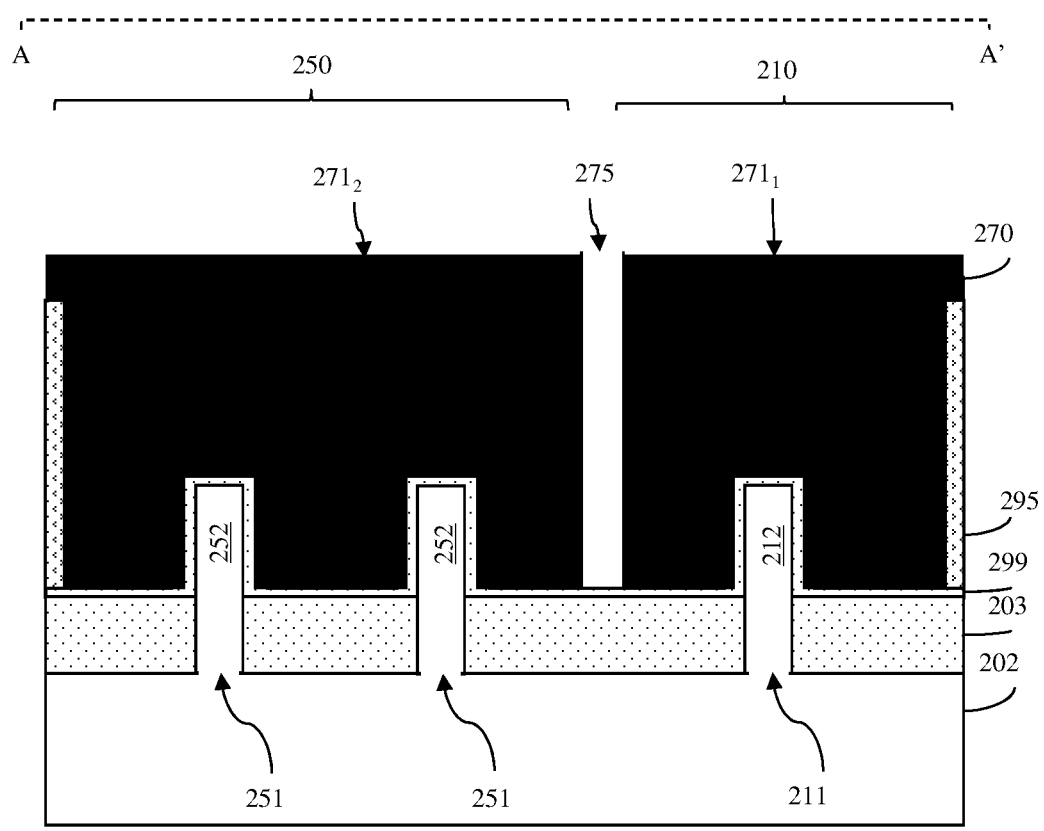
FIGS. 11A-11D are different cross-section diagrams illustrating a partially completed structure formed according to the flow diagram of FIG. 1.
Figure 11B:
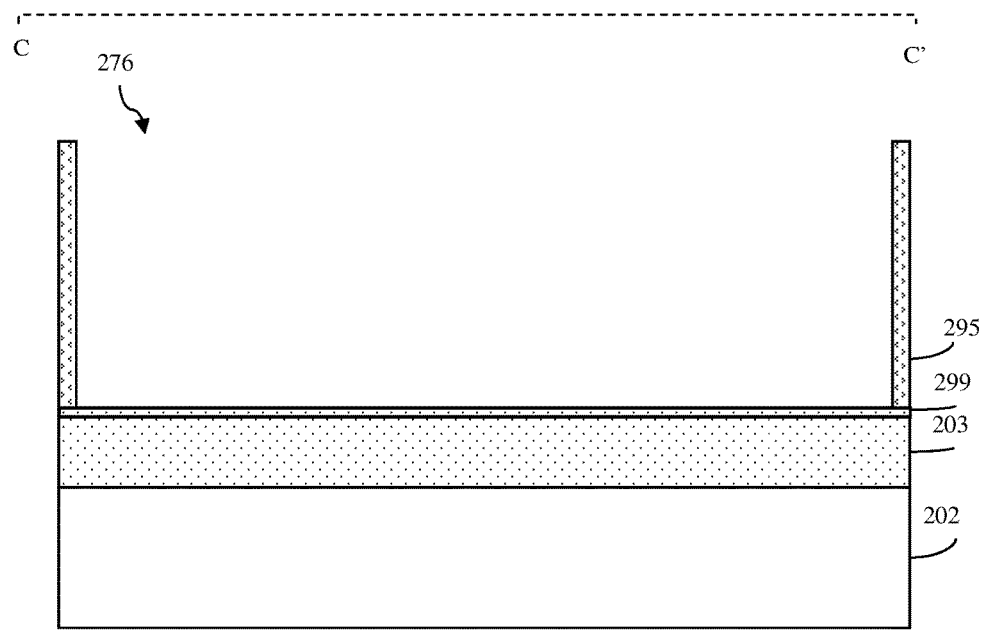
Figure 11C:
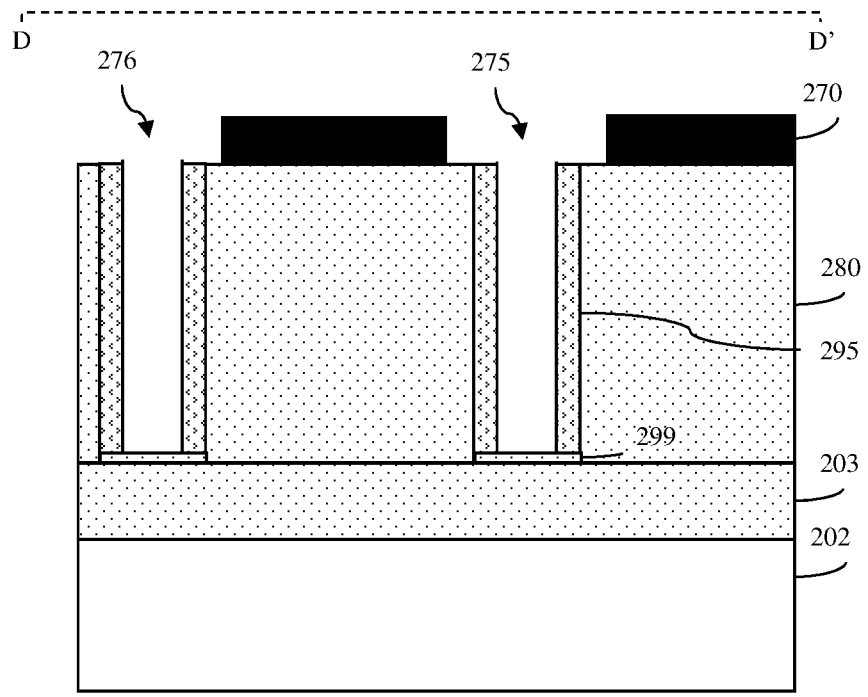
Figure 11D:
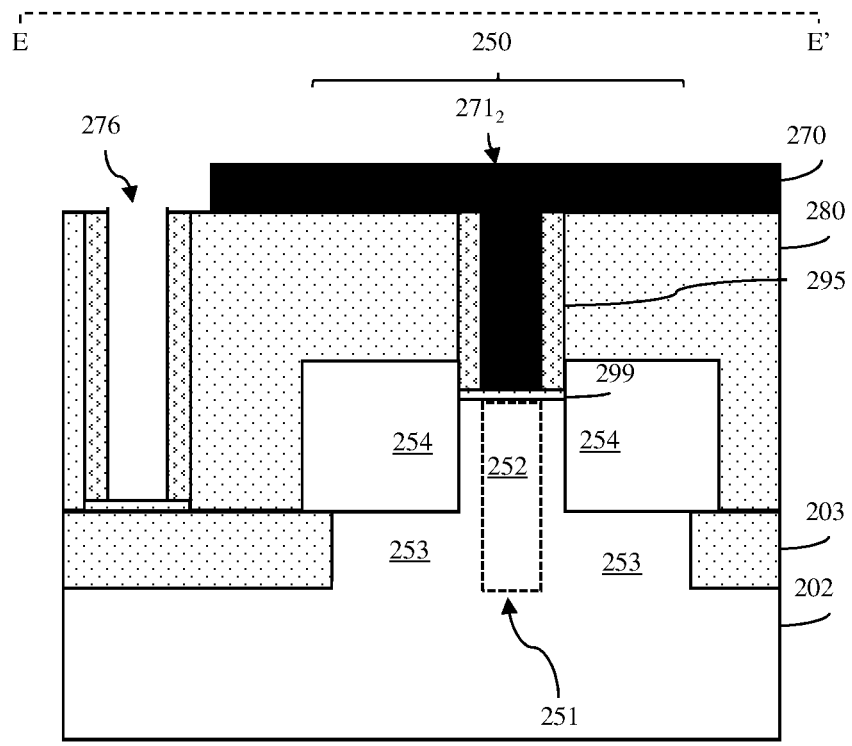
Figure 12A:
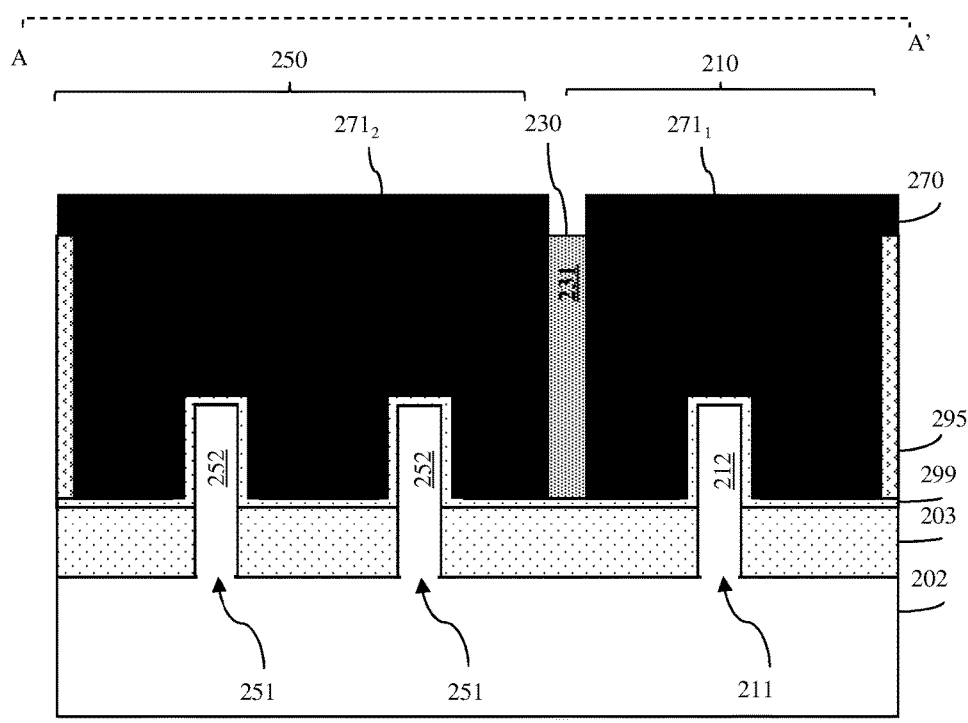
FIGS. 12A-12D are different cross-section diagrams illustrating a partially completed structure formed according to the flow diagram of FIG. 1.
Figure 12B:
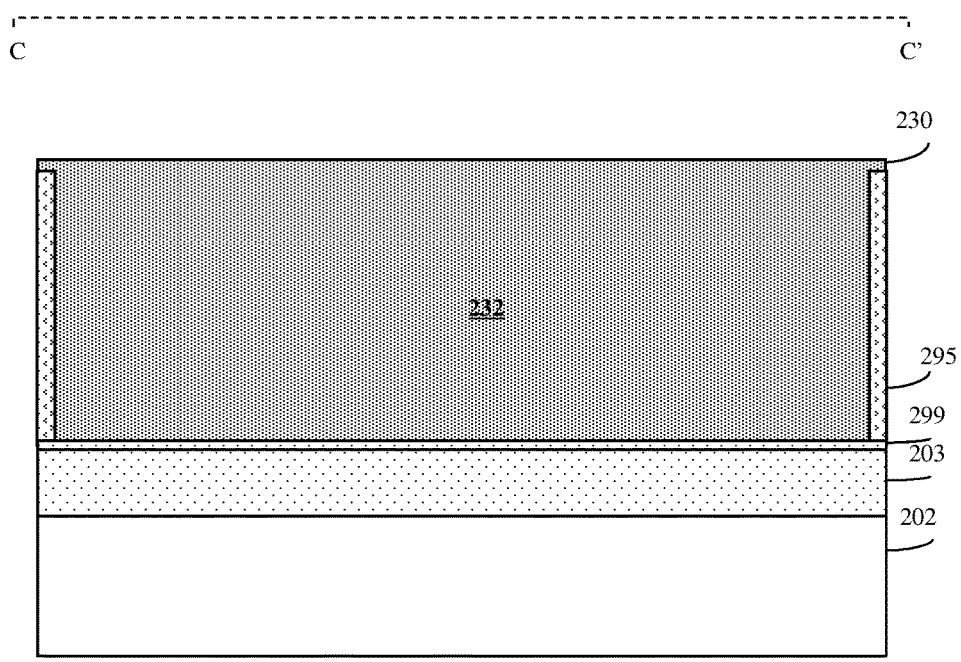
Figure 12C:
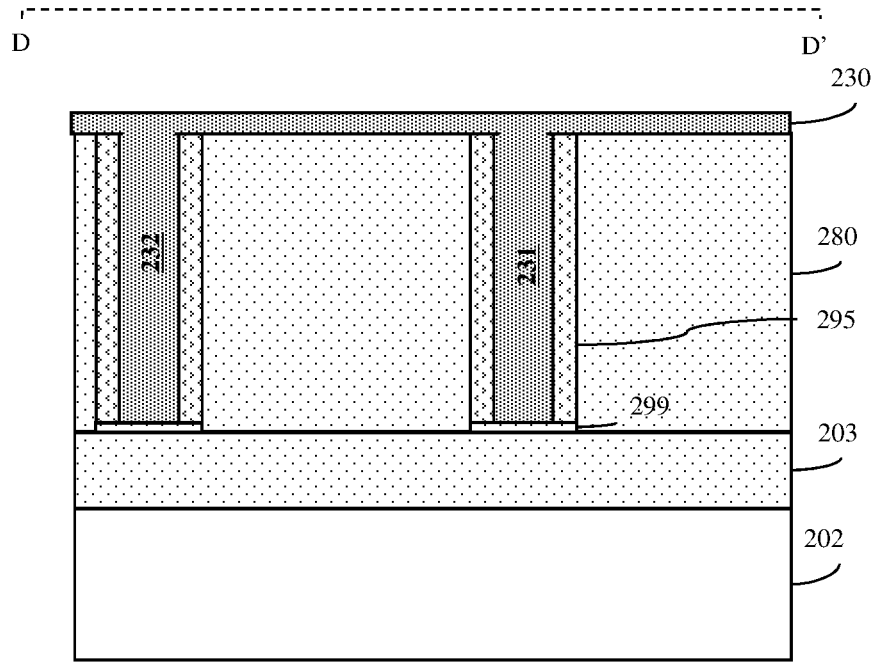
Figure 12D:
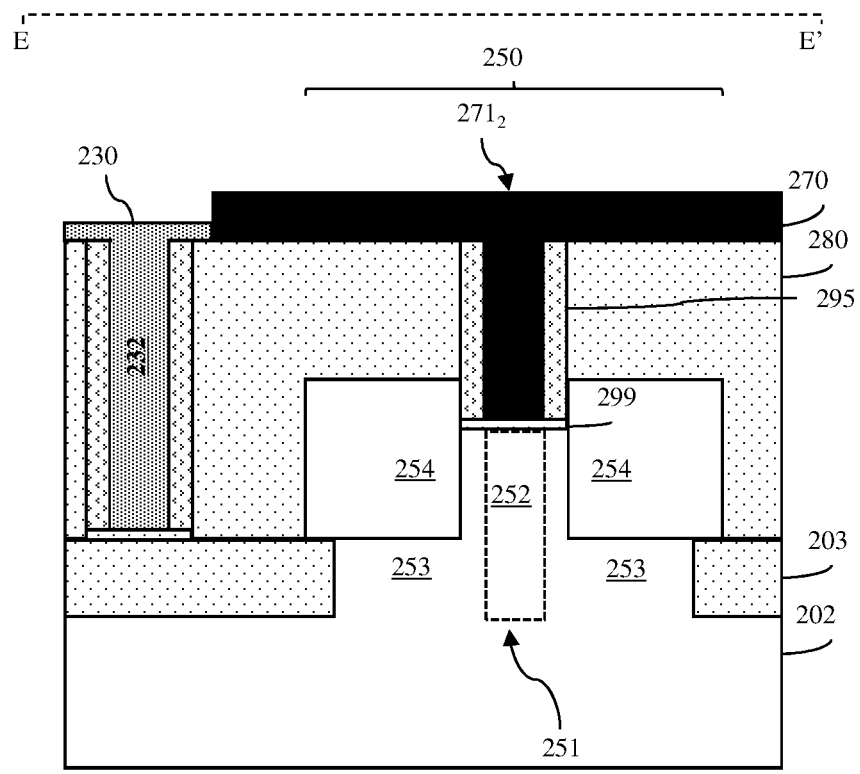

The mask layer 279 can specifically be patterned such that the gate cut opening 275 is aligned above a segment of the main second sacrificial gate 271, which is over an area between the two groups of fins (i.e., between the first semiconductor fin(s) 211 at the first channel region(s) 212 and the second semiconductor fin(s) 252 at the second channel region(s) 252), as illustrated in FIGS. 10A, 10C, and 10D. The gate cut opening 275 can be oriented essentially perpendicular to the main second sacrificial gate 271 and can extend laterally across the full length of the main second sacrificial gate 271 (as measured in a direction parallel to the semiconductor fins 211, 251) and can, optionally, further extend laterally over the adjacent sidewall spacer 295 and ILD material 280 on one or both sides of the first additional sacrificial gate 271. The width of the gate cut opening 275 (as measured in a direction perpendicular to the semiconductor fins 211, 251) can be significantly less than the distance between an innermost first semiconductor fin and an innermost second semiconductor fin such that the gate cut opening 275 does not extend laterally to either of these fins.

The mask layer 279 can further be patterned such that the optional gate removal opening 276 is aligned over the entire additional second sacrificial gate 272 (e.g., extending laterally across the full length and full width of the additional second sacrificial gate 272), as illustrated in FIGS. 10A, 10C, 10D and 10E. This gate removal opening 276 can further extend laterally over the adjacent sidewall spacer 295 and ILD material 280 on any side and/or on any end of the additional second sacrificial gate 272.

Subsequently, a selective anisotropic etch process can be performed in order to extend the gate cut opening 275 and, if present, the gate removal opening 276 vertically by selectively removing portions of the second sacrificial material 270 exposed within those opening(s) (see process 124 and FIGS. 11A-11D). This etch process can be, for example, a reactive ion etch process, which uses a plasma of oxygen, hydrogen, nitrogen, sulfur dioxide, carbon mono oxide (CO), carbon dioxide (CO2) or combinations thereof. Alternatively, this etch process can be any other suitable anisotropic etch process that can selectively etches the second sacrificial material 270 over the dielectric materials of any portions of the conformal dielectric layer 299, the sidewall spacer 295 and ILD material 280 exposed within the opening(s). Thus, this etch process will result in removal of the second sacrificial material from only that segment of the main second sacrificial gate 271 exposed by the gate cut opening 275. That is, this etch process will result in a cut in the main second sacrificial gate 271 that effectively divides the first main second sacrificial gate 271 into a first section $271_1$ and a second section $271_2$. The first section $271_1$ will be adjacent to the top surface and opposing sidewalls of the first semiconductor fin(s) 211 at the first channel region(s) 212 and the second section $271_2$ will be adjacent to the top surface and opposing sidewalls of the second semiconductor fin(s) 251 at the second channel region(s) 252. Furthermore, if the mask layer was also patterned with a gate removal opening 276, this etch process will also result in the removal of the additional second sacrificial gate 272, in its entirety and, thereby will result in the formation of a trench that is laterally surrounded by a sidewall spacer 295.

Following this process 124, the mask layer 279 can be selectively removed and a dielectric fill material 230 can be deposited over the partially completed structure and, particularly, into the cut (i.e., into the extended gate cut opening 275) and into the trench (i.e., into the extend gate removal opening 276), if present, in order to form a gate cut isolation region 231 and an additional isolation region 232, respectively (see process 126 and FIGS. 12A-12D). This dielectric fill material 230 can be, for example, silicon nitride, silicon oxycarbide or any other suitable dielectric fill material. The dielectric fill material 230 can subsequently be recessed in order to expose the top surface the remaining second sacrificial material 270.

It should be noted that, because the second sacrificial material 270 (e.g., amorphous carbon) is more selectively and anisotropically etchable over the dielectric materials used (e.g., over silicon dioxide, etc.) than the first sacrificial material (e.g., polysilicon or amorphous silicon) and, more particularly, because etching of amorphous carbon is very controllable, the method embodiments disclosed herein ensure that the entire segment of the main second sacrificial gate 271 exposed within the gate cut opening 275 is removed at process 124 (stopping on the conformal dielectric layer 299). Thus, no polysilicon or amorphous silicon will be left below the gate cut isolation region 231 and a short between replacement metal gates (RMGs), which will subsequently be formed on either side of the gate cut isolation region 231 at process 128 (see detailed discussion below), will be avoided. Additionally, it should be noted that, due to the use of the second sacrificial material (e.g., amorphous carbon) and the above-mentioned anisotropic etch process, which is highly selective for the amorphous carbon over the dielectric materials of the conformal dielectric layer 299, the ILD material 280 and sidewall spacers 295, the method embodiments disclosed herein ensure that recesses will not be formed within the ILD material 280 or sidewall spacers 295 during etching, at process 124, of the gate cut opening 275 and/or the gate removal opening 276, particularly, when any of these openings overlay the adjacent sidewall spacer 295 and ILD material 280. By avoiding the formation of such recesses in the ILD material 280 and/or sidewall spacer 295 and, particularly, recesses that would otherwise be filled with the dielectric fill material 230 at process 126, the embodiments effectively control the critical dimension of the resulting gate cut isolation region 231 or, if applicable, the additional isolation region 232.

Figure 13A:
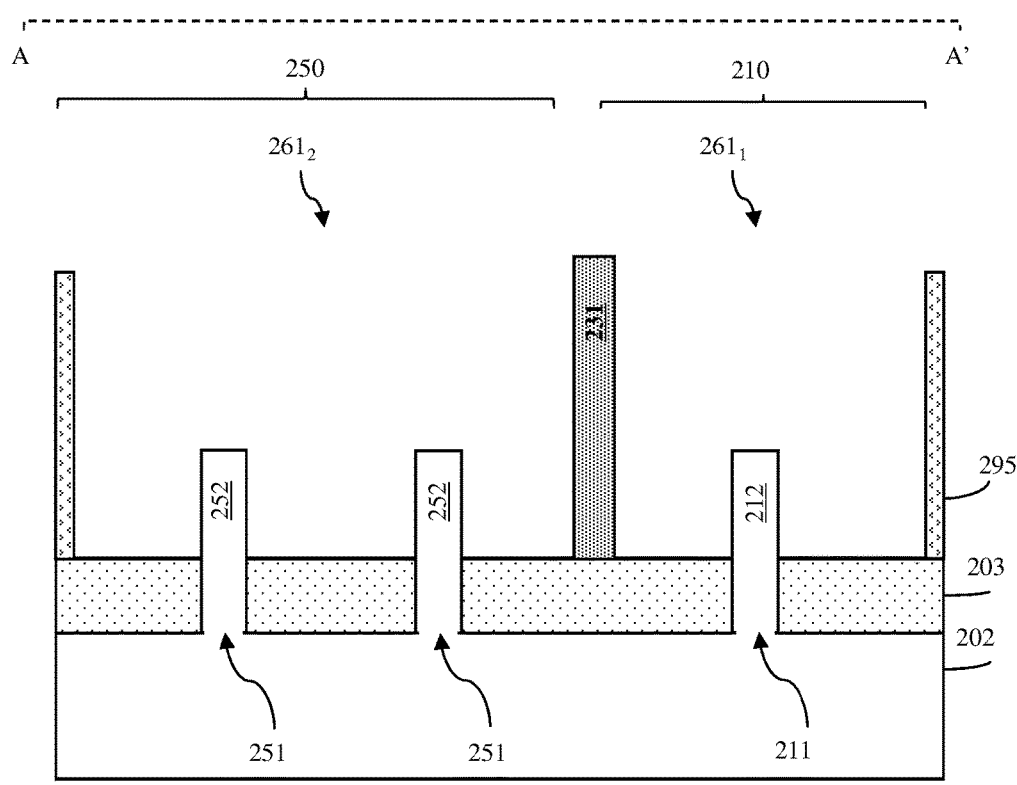
FIGS. 13A-13C are different cross-section diagrams illustrating a partially completed structure formed according to the flow diagram of FIG. 1.
Figure 13B:
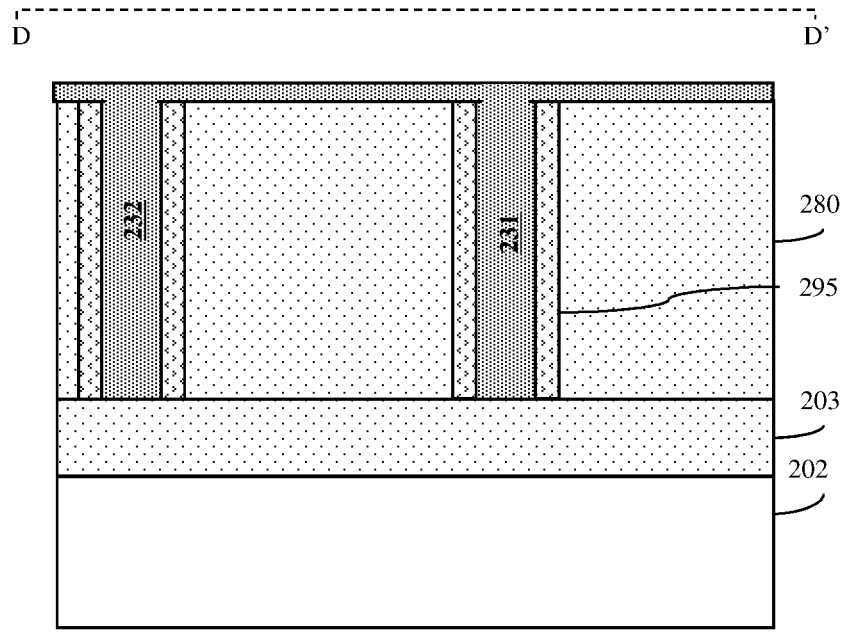
Figure 13C:
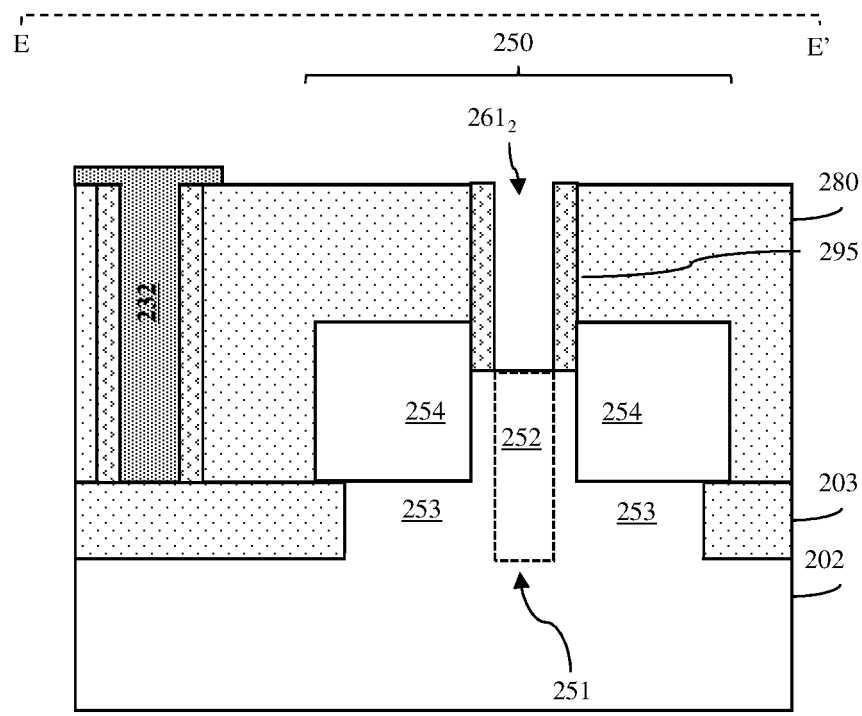
Figure 14A:
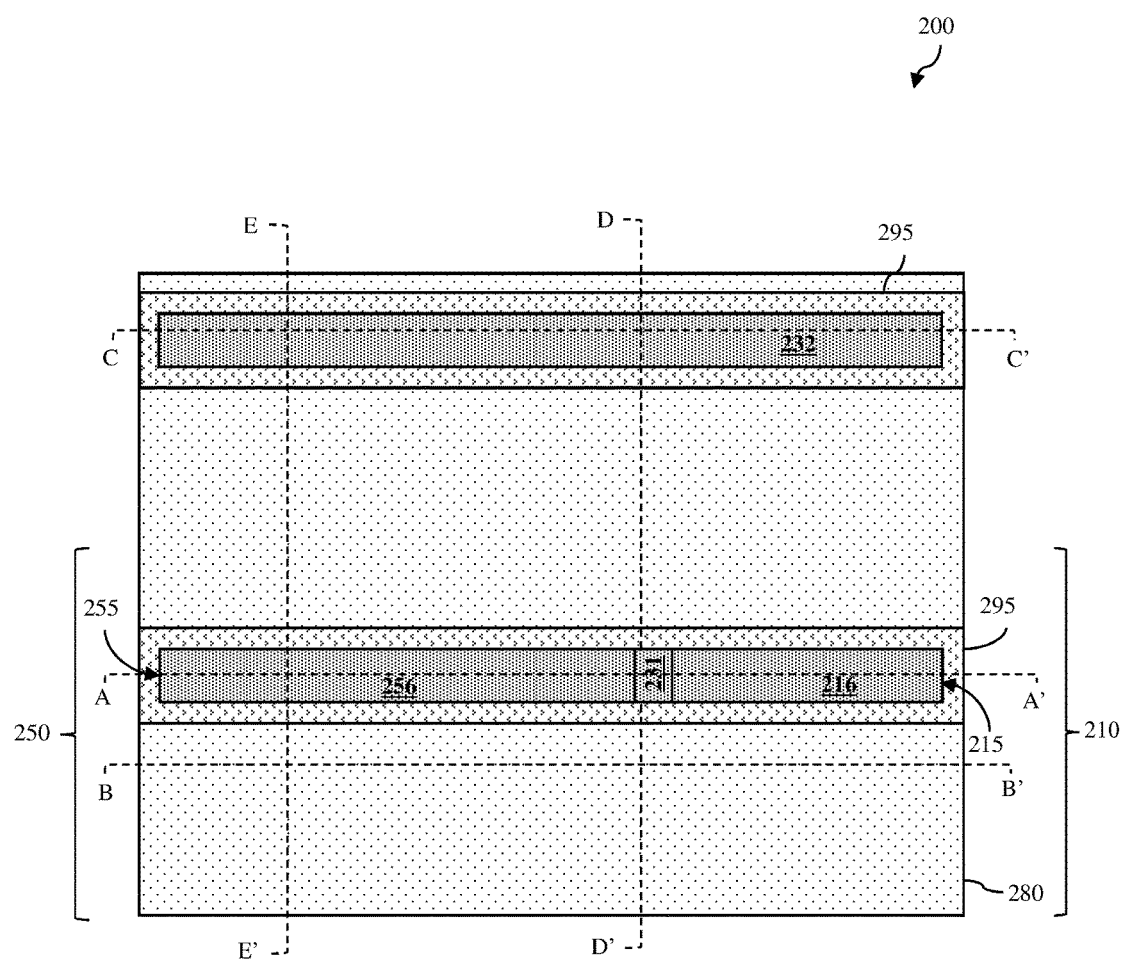
FIG. 14A is a top view diagram and FIGS. 14B-14F are different cross-section diagrams illustrating a structure formed according to the flow diagram of FIG. 1.
Figure 14B:
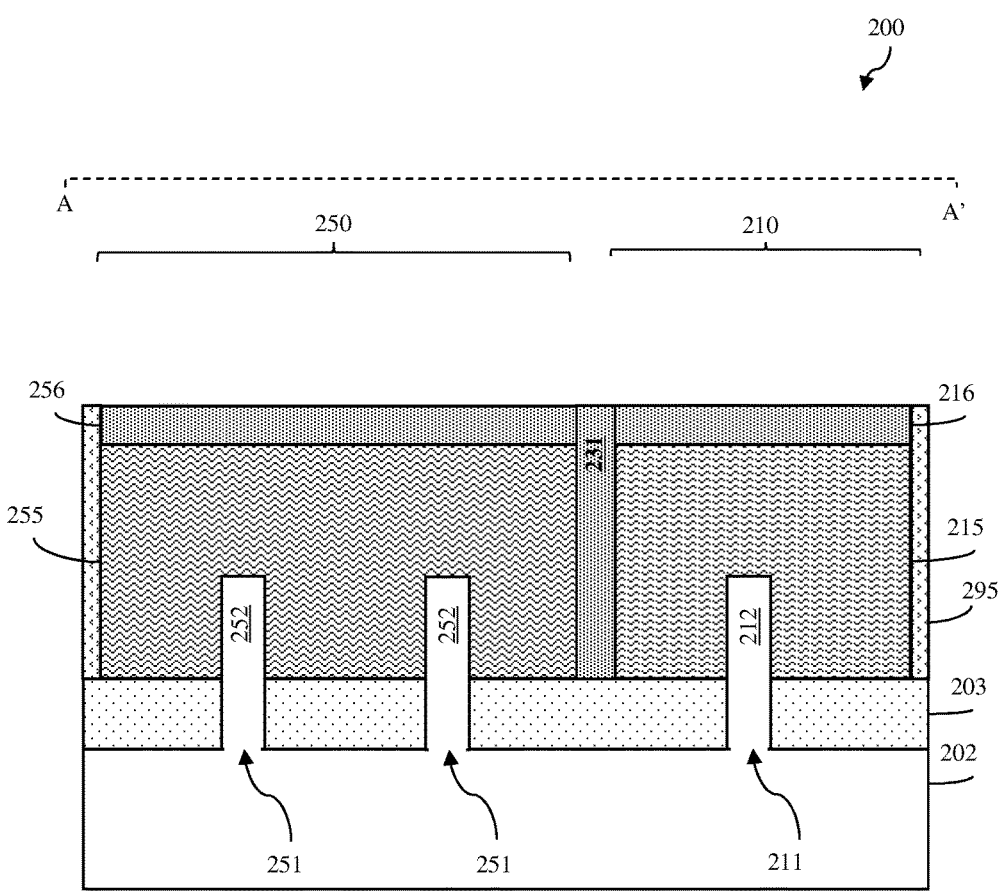
Figure 14C:
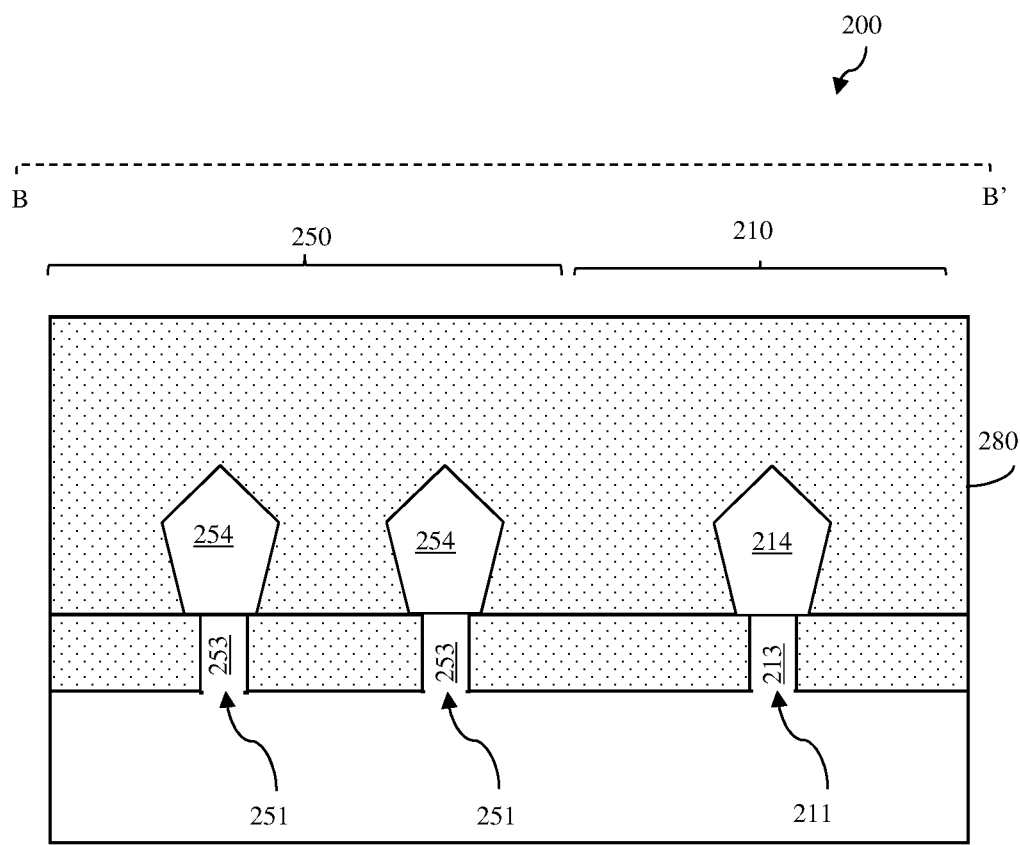
Figure 14D:
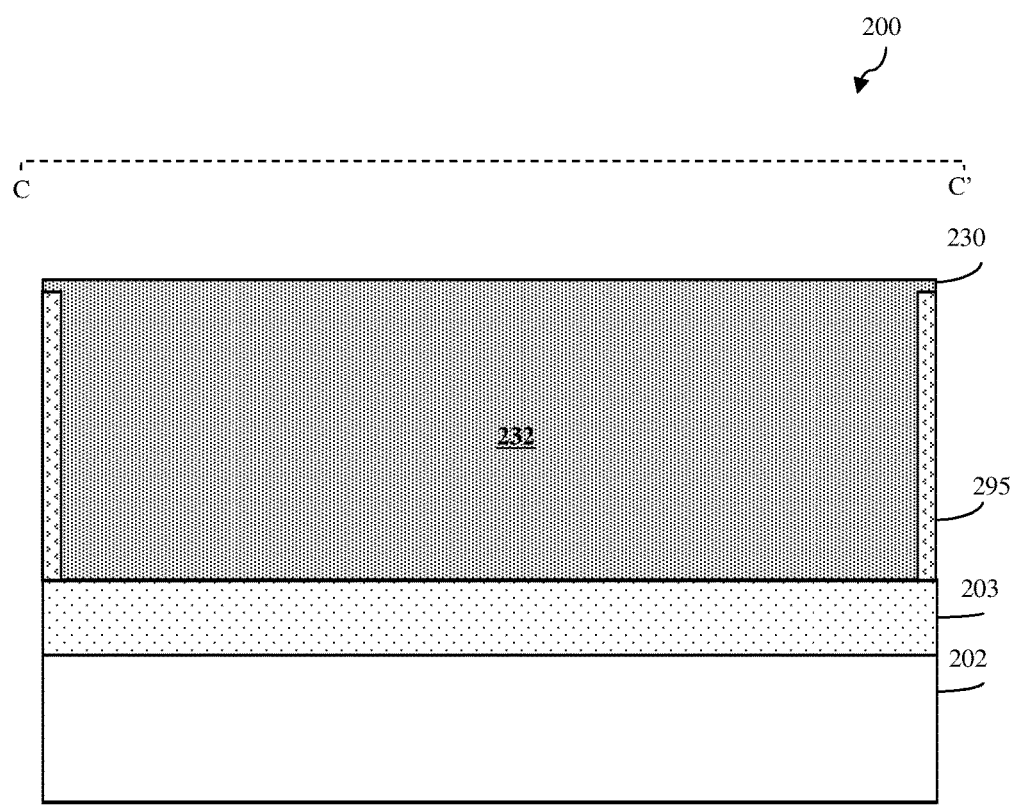
Figure 14E:
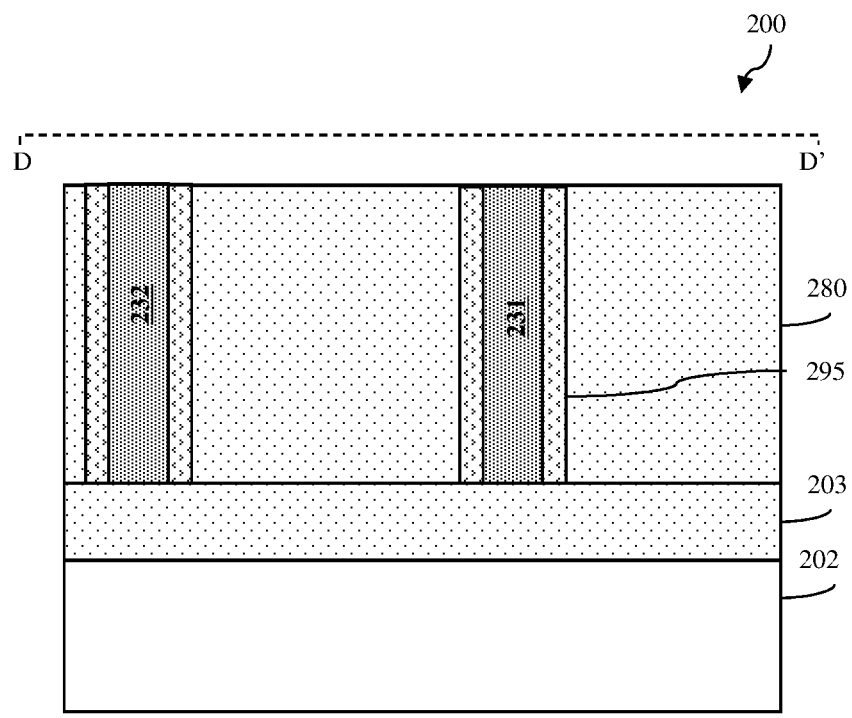
Figure 14F:
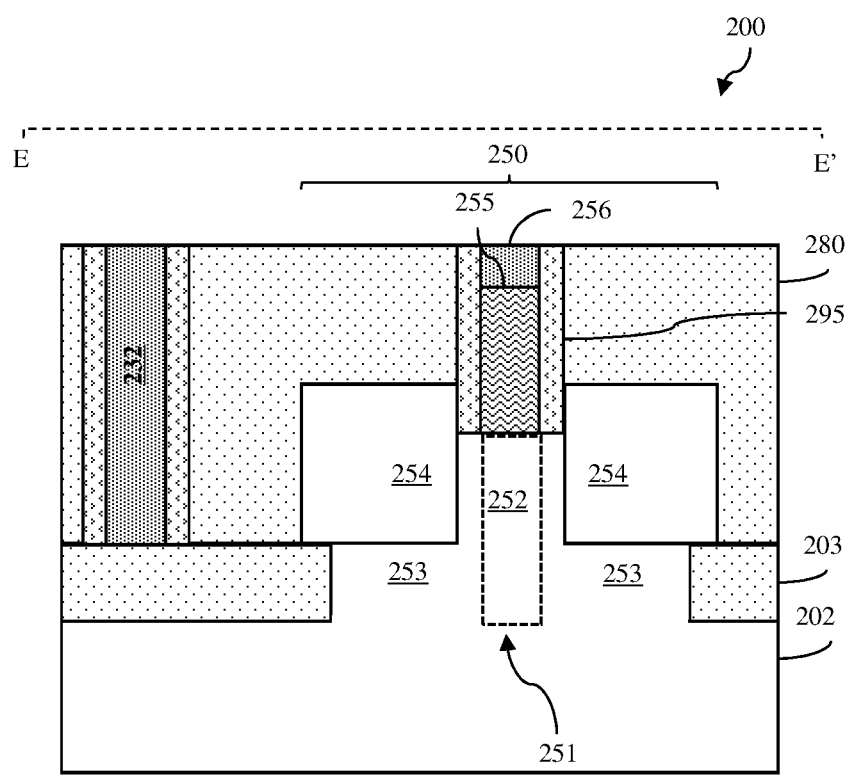

Following formation of the gate cut isolation region 231 and, if applicable, the additional isolation region 232, replacement metal gate (RMG) processing can be performed (see process 128). Specifically, the remaining second sacrificial material 270 and, particularly, the two sections $271_1$-$271_2$ of the main second sacrificial gate, which are physically separated by the gate cut isolation region 231, can be selectively removed (e.g., using the same selective etch process used above at process 124 chemistry described above at process 124), thereby creating a first RMG opening $261_1$ and a second RMG opening $261_2$, respectively (FIGS. 13A-13C). After removal of the remaining second sacrificial material, the etch chemistry can be altered in order to selectively remove exposed portions of the conformal dielectric layer 299 within the first RMG opening $261_1$ and a second RMG opening $261_2$, thereby exposing the top surface and opposing sidewalls of the first semiconductor fin(s) 211 at the first channel region(s) 212 and the top surface and opposing sidewalls of the second semiconductor fin(s) 251 at the second channel region(s) 252. It should be noted that the method embodiments described above only require a single CMP, which exposes the sacrificial gate(s) at process 112 and which could potentially reduce gate height. Subsequent processing prior to formation of the RMGs at process 128 does not require additional CMP. Thus, the method embodiments provide for improved gate height control (e.g., over the PC cut last technique which includes three CMP steps between the gate cut and formation of the RMGs).

Next, a first RMG 215 can be formed within in the first RMG opening $261_1$ adjacent to the first channel region(s) 212 and a second RMG 255 can be formed in the second RMG opening $261_2$ adjacent to the second channel region(s) 252 (see FIGS. 14A-14F). The first RMG 215 can be formed so that it has a first work function, which is optimal for performance of a first-type FINFET (e.g., a P-type FINFET), whereas the second RMG 255 can be formed so that it has a second work function, which is different from the first work function and which is optimal for performance of a second-type FINFET (e.g., an N-type FINFET).

In the above-described method embodiments, the following exemplary processes can be used to form the first RMG 215 and the second RMG 255. For example, a gate dielectric layer (e.g., a high-K gate dielectric layer) can be conformally deposited so as to cover the exposed top surfaces and sidewalls of the first semiconductor fin(s) 211 in the first RMG opening $261_1$ and the second semiconductor fin(s) 251 in the second RMG opening $261_2$. Those skilled in the art will recognize that a high-K gate dielectric layer refers to a layer of dielectric material with a dielectric constant that is greater than the dielectric constant of silicon dioxide (i.e., greater than 3.9). Exemplary high-K dielectric materials that may be used in RMGs include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). In any case, due to the conformal deposition process, the gate dielectric layer will also cover exposed horizontal surfaces of the isolation layer 203 and vertical surfaces of the sidewall spacer 295 within each RMG opening.

The high-K gate dielectric layer can be subjected to a high-K reliability anneal process, which is performed in order to improve the reliability of this high-K gate dielectric layer. For example, a conformal sacrificial titanium nitride (TiN) layer can be deposited on the high-K gate dielectric layer and a sacrificial amorphous silicon layer can be deposited onto the sacrificial titanium nitride layer. A thermal anneal process can then be performed in order to modify the molecular structure of the high-K gate dielectric layer so as to improve its reliability (e.g., to minimize gate leakage, negative bias temperature instability, etc.). Following the thermal anneal, cleaning processes can be performed to completely remove the sacrificial amorphous silicon and titanium nitride layers.

It should be noted that, by controlling the critical dimension of the gate cut isolation region 231, the method embodiments minimize the risk that the space between a semiconductor fin 211 or 251 and the gate cut isolation region 231 will be too narrow to permit proper deposition of the sacrificial TiN layer and the sacrificial amorphous silicon required for the high-K reliability anneal. By ensuring that the fin-to-gate cut isolation region space is not too narrow, the method embodiments avoid pinch-off of the sacrificial amorphous silicon layer that can result in void formation. As discussed above in the background section, oxide coatings can be formed within such voids during the anneal and these oxide coating can, in turn, prevent TiN residue and/or TiN silicide residue from being removed during the cleaning processes. Thus, by controlling the critical dimension of the gate cut isolation region 231, the method embodiments minimize the risk of leakage issues, threshold voltage variations, etc.

Following the high-K gate reliability anneal process, a first work function metal layer can be conformally deposited over the gate dielectric layer. The metal material or metal alloy material of the conformal first work function metal layer can be preselected in order to achieve the optimal gate conductor work function in the first FINFET 210 (e.g., a P-type FINFET). Those skilled in the art will recognize that the optimal work function for a gate conductor of a P-type FINFET will be, for example, between about 4.9 eV and about 5.2 eV. Exemplary metals (and metal alloys), which have a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The first work function metal layer can then be chamfered and patterned so as to remove it from the second RMG opening $261_2$. The chamfering process can include: depositing a protective fill material onto the first work function metal layer; recessing the protective fill material; etching away the exposed first work function metal material from above the protective fill material such that the maximum height of the first work function metal layer is below the level of the top surface of the sidewall spacer 295; and removing the protective fill material. The patterning process can include: forming a protective mask over the first RMG opening $261_1$, removing (e.g., selectively etching away) the first work function metal layer from the second RMG opening $261_2$, and removing protective mask.

Next, a second work function metal layer can be conformally deposited over the first work function metal layer in the first RMG opening $261_1$ and over exposed the gate dielectric material in the second RMG opening $261_2$. The metal material or metal alloy material of the conformal second work function metal layer can be preselected in order to achieve the optimal gate conductor work function in the second FINFET 250 (e.g., an N-type FINFET). Those skilled in the art will further recognize that the optimal work function for a gate conductor of an N-type FINFET will be, for example, between 3.9 eV and about 4.2 eV. Exemplary metals (and metal alloys), which have a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The second work function metal layer can then be chamfered. The chamfering process can include: depositing a protective fill material onto the second work function metal layer; recessing the protective fill material; etching away the exposed second work function metal material from above the protective fill material such that the maximum height of the second work function metal layer is below the level of the top surface of the sidewall spacer 295; and removing the protective fill material.

Finally, a conductive fill material can be deposited to fill any remaining space in the RMG openings and a polishing process (e.g., a CMP process) can be performed to remove any RMG materials from above the top surface of the ILD material 280. The conductive fill material of the RMGs can be any suitable metal or metal alloy fill material including, but not limited to, tungsten, a tungsten alloy (e.g., tungsten silicide or titanium tungsten), cobalt, or aluminum.

It should be noted that various RMG structures and the techniques for making them are well known in the art. The exemplary description provided above is not intended to be limiting and, alternatively, any other techniques for forming RMGs could be incorporated into the disclosed method embodiments. Consequently, only the first and second RMGs 215, 255, as a whole, are illustrated in FIGS. 14A-14F. The individual components of each of these RMGs 215, 255, including, for example, the gate dielectric layer, the work function metal layer(s), the conductive fill material, etc., are not specifically illustrated in the figures in order to allow the reader to focus on the more salient aspects of the disclosed method.

Dielectric gate caps 216, 256 can be formed on the top surfaces of the first RMG 215 and the second RMG 255, respectively. For example, the conductive fill material of the first RMG 215 and the second RMG 255 can be recessed (i.e., etched back) and a dielectric cap layer (e.g., a silicon nitride cap layer) can be deposited over the partially completed structure so as to fill the recesses above the conductive fill material. Next, a polishing process (e.g., a CMP process) can be performed so as to remove any of the dielectric cap material from above the top surfaces of the ILD material 280, thereby forming the dielectric gate caps 216, 256. Due to the presence of the gate cut isolation region 231 and the dielectric gate caps 216, 256, the resulting RMGs 215 and 255 will be physically and electrically isolated from each other.

Additional processing can subsequently be performed in order to complete the IC structure 200, which is shown in FIGS. 14A-14F, which incorporates FINFETs 210 and 250 with RMGs 215 and 255 and a gate cut isolation region 231 between the RMGs 215 and 255 and which, optionally, also incorporates an additional isolation region 232 that is parallel to and physically separated from the RMGs 215, 255 (e.g., above the isolation layer 203) adjacent to one end of the first semiconductor fin(s) 211 of the first FINFET 210 and the second semiconductor fin(s) 251 of the second FINFET 250 (see process 130). This additional processing can include, but is not limited to, middle of the line (MOL) processing (e.g., forming metal plugs to the source/drain regions, forming source/drain contacts to the metal plugs and forming gate contacts to the first and second RMGs) and back end of the line (BEOL) processing (e.g., forming the BEOL metal levels).

It should be understood that, in the embodiments described above, different dopants can be used to achieve the different type conductivities in the different regions of the semiconductor fins. Furthermore, the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

Additionally, it should be understood that the terminology used herein is for the purpose of describing the disclosed method and structure and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of an improved method for forming an integrated circuit (IC) structure that incorporates multiple field effect transistors (FETs) (e.g., fin-type field effect transistors (FINFETs)) with replacement metal gates (RMGs) and a gate cut isolation region between the RMGs. The disclosed embodiments specifically include process steps designed to improve gate cut isolation region critical dimension control. In the embodiments, prior to RMG formation, an originally formed sacrificial gate, which is adjacent to a first channel region and a second channel region and which is made of a first sacrificial material (e.g., polysilicon or amorphous silicon), can be replaced with another sacrificial gate, which is made of a second sacrificial material (e.g., amorphous carbon) that is more selectively and anisotropically etchable than the first sacrificial material. A cut can be formed through this other sacrificial gate, thereby dividing it into a first section adjacent to the first channel region and a second section adjacent to the second channel region. The cut can then be filled with dielectric fill material to form the gate cut isolation region. The use of the second sacrificial material ensures that, when a gate cut opening in a mask pattern that is used to form the gate cut extends over the gate sidewall spacer or even the interlayer dielectric (ILD) material, recesses will not be formed within the gate sidewall spacer or ILD material. By avoiding the formation of such recesses that would subsequently be filled with the dielectric fill material, the embodiments effectively control the critical dimension of the gate cut isolation region.

What is claimed is:

1. A method comprising:

forming, on a substrate, a first semiconductor fin and a second semiconductor fin adjacent to the first semiconductor fin;

forming a conformal dielectric layer over the first semiconductor fin and the second semiconductor fin;

forming, on the conformal dielectric layer, a first sacrificial gate that traverses a first channel region of the first semiconductor fin and a second channel region of the second semiconductor fin, the first sacrificial gate comprising a first sacrificial material;

forming a sidewall spacer on the first sacrificial gate;

forming first source/drain regions in the first semiconductor fin and second source/drain regions in the second semiconductor fin such that the first channel region is positioned laterally between the first source/drain regions and the second channel region is positioned laterally between the second source/drain regions;

depositing a blanket layer of interlayer dielectric material so as to cover the first sacrificial gate, the sidewall spacer, the first source/drain regions and the second source/drain regions;

polishing the interlayer dielectric material to expose a top surface of the first sacrificial gate;

removing the first sacrificial gate to form a preliminary gate opening that exposes portions of the conformal dielectric layer adjacent to the first channel region and the second channel region;

depositing a second sacrificial material that is different from the first sacrificial material onto the interlayer dielectric material and into the preliminary gate opening to form a second sacrificial gate;

forming a cut that extends vertically through the second sacrificial gate and that divides the second sacrificial gate into a first section adjacent to the first channel region and a second section adjacent to the second channel region;

depositing a dielectric fill material into the cut to form a gate cut isolation region; and after the forming of the gate cut isolation region, selectively removing the first section and the second section to form a first gate opening and a second gate opening, respectively.

2. The method of claim 1, further comprising:
forming a first replacement metal gate in the first gate opening and a second replacement metal gate in the second gate opening.

3. The method of claim 2, further comprising, after the depositing of the dielectric fill material and before the selectively removing of the first section and the second section, recessing the dielectric fill material to expose remaining portions of the second sacrificial material.

4. The method of claim 1, the forming of the cut comprising:
forming a mask layer;
patterning the mask layer with a gate cut opening that is aligned above a segment of the second sacrificial gate between the first channel region and the second channel region; and
performing a selective anisotropic etch process to remove the second sacrificial material from the segment exposed by the gate cut opening.

5. The method of claim 4, wherein the gate cut opening has at least one end extending laterally over the sidewall spacer and the interlayer dielectric material adjacent to the sidewall spacer and wherein the selective anisotropic etch process selectively etches away the second sacrificial material stopping on the interlayer dielectric material and the sidewall spacer without forming recesses in the interlayer dielectric material and the sidewall spacer.

6. The method of claim 5, wherein the first sacrificial material is replaced with the second sacrificial material prior to the forming of the cut because the second sacrificial material is more selectively and anisotropically etchable than the first sacrificial material such that, during subsequent processing, formation of recesses within the interlayer dielectric material is avoided and a critical dimension of the gate cut isolation region is controlled.

7. The method of claim 1, the first sacrificial material comprising any of polysilicon and amorphous silicon and the second sacrificial material comprising amorphous carbon.

8. A method comprising:
forming, on a substrate, a first semiconductor fin and a second semiconductor fin adjacent to the first semiconductor fin;
forming a conformal dielectric layer over the first semiconductor fin and the second semiconductor fin;
forming, on the conformal dielectric layer, a first sacrificial gate that traverses a first channel region of the first semiconductor fin and a second channel region of the second semiconductor fin, the first sacrificial gate comprising a first sacrificial material;
forming a sidewall spacer on the first sacrificial gate;
forming first source/drain regions in the first semiconductor fin and second source/drain regions in the second semiconductor fin such that the first channel region is positioned laterally between the first source/drain regions and the second channel region is positioned laterally between the second source/drain regions;
depositing a blanket layer of interlayer dielectric material so as to cover the first sacrificial gate, the sidewall spacer, the first source/drain regions and the second source/drain regions;
polishing the interlayer dielectric material to expose a top surface of the first sacrificial gate;
removing the first sacrificial gate to form a preliminary gate opening that exposes portions of the conformal dielectric layer adjacent to the first channel region and the second channel region;
depositing a second sacrificial material that is different from the first sacrificial material onto the interlayer dielectric material and into the preliminary gate opening to form a second sacrificial gate;
forming a cut that extends vertically through the second sacrificial gate and that divides the second sacrificial gate into a first section adjacent to the first channel region and a second section adjacent to the second channel region;
depositing a dielectric fill material into the cut to form a gate cut isolation region;
selectively removing the first section to form a first replacement metal gate opening and the second section to form a second replacement metal gate opening; and
forming a first replacement metal gate in the first replacement metal gate opening and a second replacement metal gate in the second replacement metal gate opening.

9. The method of claim 8, further comprising, after the depositing of the dielectric fill material and before the selectively removing of the first section and the second section, recessing the dielectric fill material to expose remaining portions of the second sacrificial material.

10. The method of claim 8, the forming of the cut comprising:
forming a mask layer;
patterning the mask layer with a gate cut opening that is aligned above a segment of the second sacrificial gate between the first channel region and the second channel region; and
performing a selective anisotropic etch process to remove the second sacrificial material from the segment exposed by the gate cut opening.

11. The method of claim 10, wherein the gate cut opening has at least one end extending laterally over the sidewall spacer and the interlayer dielectric material adjacent to the sidewall spacer and wherein the selective anisotropic etch process selectively etches away the second sacrificial material stopping on the interlayer dielectric material and the sidewall spacer without forming recesses in the interlayer dielectric material and the sidewall spacer.

12. The method of claim 11, wherein the first sacrificial material is replaced with the second sacrificial material prior to the forming of the cut because the second sacrificial material is more selectively and anisotropically etchable than the first sacrificial material such that, during subsequent processing, formation of recesses within the interlayer dielectric material is avoided and a critical dimension of the gate cut isolation region is controlled.

13. The method of claim 8, the first sacrificial material comprising any of polysilicon and amorphous silicon and the second sacrificial material comprising amorphous carbon.

* * * * *